(12) United States Patent
Lee et al.

(10) Patent No.: US 12,446,447 B2
(45) Date of Patent: Oct. 14, 2025

(54) DISPLAY APPARATUS

(71) Applicant: Samsung Display Co., Ltd., Yongin-si (KR)

(72) Inventors: Kyunghee Lee, Yongin-si (KR); Mihwa Lee, Yongin-si (KR); Jeongmyo Sim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 476 days.

(21) Appl. No.: 17/654,329

(22) Filed: Mar. 10, 2022

(65) Prior Publication Data
US 2023/0013127 A1    Jan. 19, 2023

(30) Foreign Application Priority Data

Jun. 29, 2021   (KR) .................. 10-2021-0084873

(51) Int. Cl.
*H10K 59/80* (2023.01)
*H10K 50/844* (2023.01)
*H10K 50/856* (2023.01)
*H10K 50/86* (2023.01)

(52) U.S. Cl.
CPC ....... *H10K 59/8791* (2023.02); *H10K 50/844* (2023.02); *H10K 50/856* (2023.02); *H10K 50/865* (2023.02); *H10K 59/873* (2023.02); *H10K 59/878* (2023.02); *H10K 59/8792* (2023.02)

(58) Field of Classification Search
CPC ....... H10K 50/00–87; H10K 59/00–88; H10K 71/00–441; H10K 71/831–861; H10K 71/50; H10K 2102/301; H10K 2102/341; H10K 2102/30; H10K 2102/361; H10K 2102/311; H10K 70/00; H10K 30/865; H10K 2101/00–80; H10K 85/00–761; H10K 77/10; H10K 77/111; H05B 33/02; H05B 33/06; H05B 33/10; H05B 33/22; B32B 2457/206
See application file for complete search history.

(56) References Cited

U.S. PATENT DOCUMENTS

| 8,536,781 B2 | 9/2013 | Lee et al. |
| 8,759,822 B2 | 6/2014 | Lee et al. |
| 10,317,590 B2 | 6/2019 | Lee et al. |
| 10,361,400 B2 | 7/2019 | Kim et al. |
| 11,706,939 B2 | 7/2023 | Seo et al. |

(Continued)

FOREIGN PATENT DOCUMENTS

| KR | 10-1076262 B1 | 10/2011 |
| KR | 10-2015-0101106 A | 9/2015 |

(Continued)

*Primary Examiner* — David Vu
(74) *Attorney, Agent, or Firm* — Womble Bond Dickinson (US) LLP

(57) ABSTRACT

A display apparatus includes: a substrate; a light-emitting element on the substrate; a low-reflection layer on the light-emitting element and including an inorganic material; and a reflection control layer on the low-reflection layer and configured to absorb light in at least three wavelength bands selected from a first wavelength band of 430 nm or less, a second wavelength band of 480 nm to 510 nm, a third wavelength band of 575 nm to 605 nm, and a fourth wavelength band of 650 nm or greater.

20 Claims, 18 Drawing Sheets

(56) References Cited

U.S. PATENT DOCUMENTS

| | | | |
|---|---|---|---|
| 2008/0037094 A1 | 2/2008 | Hwang et al. | |
| 2016/0380235 A1* | 12/2016 | Kim | H10K 85/636 |
| | | | 257/40 |
| 2017/0062529 A1* | 3/2017 | Paek | H10K 59/38 |
| 2022/0085335 A1* | 3/2022 | Shimatsu | H10K 59/38 |

FOREIGN PATENT DOCUMENTS

| | | | |
|---|---|---|---|
| KR | 10-2016-0032793 A | | 3/2016 |
| KR | 10-2017-0001826 A | | 1/2017 |
| KR | 10-2017-0063297 A | | 6/2017 |
| KR | 10-1903056 B1 | | 10/2018 |
| KR | 10-1948053 B1 | | 4/2019 |
| KR | 20190095630 A | * | 8/2019 |
| KR | 10-2020-0100901 A | | 8/2020 |

* cited by examiner

DISPLAY APPARATUS

CROSS-REFERENCE TO RELATED APPLICATION

This application claims priority to and the benefit of Korean Patent Application No. 10-2021-0084873, filed on Jun. 29, 2021, in the Korean Intellectual Property Office, the entire content of which is hereby incorporated by reference.

BACKGROUND

1. Field

One or more embodiments of the present disclosure relate to a display apparatus, and for example, to a display apparatus having improved visibility.

2. Description of the Related Art

An organic light-emitting display apparatus is self-luminous. Unlike a liquid crystal display apparatus, the organic light-emitting display apparatus does not require a separate light source, and thus, the thickness and weight thereof may be reduced. Also, the organic light-emitting display apparatus has high quality characteristics such as low power consumption, high luminance, and fast response time.

SUMMARY

However, in the case of an existing display apparatus, visibility deteriorates due to the reflection of external light.

One or more embodiments of the present disclosure include a display apparatus in which a low-reflection layer and a reflection control layer are on a light-emitting element, thereby improving visibility. However, this is merely an example, and the scope of the disclosure is not limited thereby.

Additional aspects of embodiments will be set forth in part in the description which follows and, in part, will be apparent from the description, or may be learned by practice of the presented embodiments of the disclosure.

According to one or more embodiments, a display apparatus includes a substrate, a light-emitting element on the substrate, a low-reflection layer on the light-emitting element, the low-reflection layer including an inorganic material, and a reflection control layer on the low-reflection layer, the reflection control layer being configured to absorb light in at least three wavelength bands selected from a first wavelength band of 430 nm or less, a second wavelength band of 480 nm to 510 nm, a third wavelength band of 575 nm to 605 nm, and a fourth wavelength band of 650 nm or greater.

In the present embodiment, the reflection control layer may include at least three light absorbing materials selected from a first light absorbing material that absorbs light in the first wavelength band, a second light absorbing material that absorbs light in the second wavelength band, a third light absorbing material that absorbs light in the third wavelength band, and a fourth light absorbing material that absorbs light in the fourth wavelength band.

In the present embodiment, an amount of each of the at least three light absorbing materials may be 0.005 wt % to 5 wt %, based on the total weight of the reflection control layer.

In the present embodiment, the inorganic material may have a refractive index of 1 or greater.

In the present embodiment, the inorganic material may have an absorption coefficient of 0.5 or greater.

In the present embodiment, the inorganic material may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof.

In the present embodiment, the display apparatus may further include a light blocking layer on the light-emitting element, the light-emitting element having an opening corresponding to an emission area of the light-emitting element.

In the present embodiment, the reflection control layer may fill the opening.

In the present embodiment, the display apparatus may further include a touch sensor layer between the low-reflection layer and the reflection control layer, wherein the light blocking layer may be on the touch sensor layer.

In the present embodiment, the display apparatus may further include a capping layer between the light-emitting element and the low-reflection layer.

In the present embodiment, the display apparatus may further include an encapsulation member on the low-reflection layer.

In the present embodiment, the encapsulation member may include an encapsulation substrate, and a filler may be further between the low-reflection layer and the encapsulation substrate.

According to one or more embodiments, a display apparatus includes a substrate, a first light-emitting element, a second light-emitting element, and a third light-emitting element on the substrate, the first light-emitting element, the second light-emitting element, and the third light-emitting element being configured to emit light in different colors from each other, a low-reflection layer arranged as one body on the first to third light-emitting elements and including an inorganic material, and a reflection control layer that is on the low-reflection layer and is configured to absorb light in at least three wavelength bands selected from a first wavelength band of 430 nm or less, a second wavelength band of 480 nm to 510 nm, a third wavelength band of 575 nm to 605 nm, and a fourth wavelength band of 650 nm or greater.

In the present embodiment, the reflection control layer may include at least three light absorbing materials selected from a first light absorbing material that absorbs light in the first wavelength band, a second light absorbing material that absorbs light in the second wavelength band, a third light absorbing material that absorbs light in the third wavelength band, and a fourth light absorbing material that absorbs light in the fourth wavelength band, and an amount of each of the at least three light absorbing materials may be 0.005 wt % to 5 wt %, based on the total weight of the reflection control layer.

In the present embodiment, the inorganic material may have a refractive index of 1 or greater and an absorption coefficient of 0.5 or greater and may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof.

In the present embodiment, the display apparatus may further include a light blocking layer on the light-emitting element, the light blocking layer having an opening corresponding to an emission area of the light-emitting element, wherein the reflection control layer may fill the opening.

In the present embodiment, the display apparatus may further include an encapsulation member on the low-reflection layer, a touch sensor layer between the low-reflection layer and the reflection control layer, and a capping layer between the light-emitting element and the low-reflection layer, wherein the light blocking layer may be on the touch sensor layer.

In the present embodiment, the encapsulation member may include a thin-film encapsulation layer including at least one inorganic layer and at least one organic layer.

In the present embodiment, the encapsulation member may include an encapsulation substrate, and a filler may be further between the low-reflection layer and the encapsulation substrate.

Other aspects and features of embodiments the disclosure will become better understood through the accompanying drawings, the claims and the detailed description.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
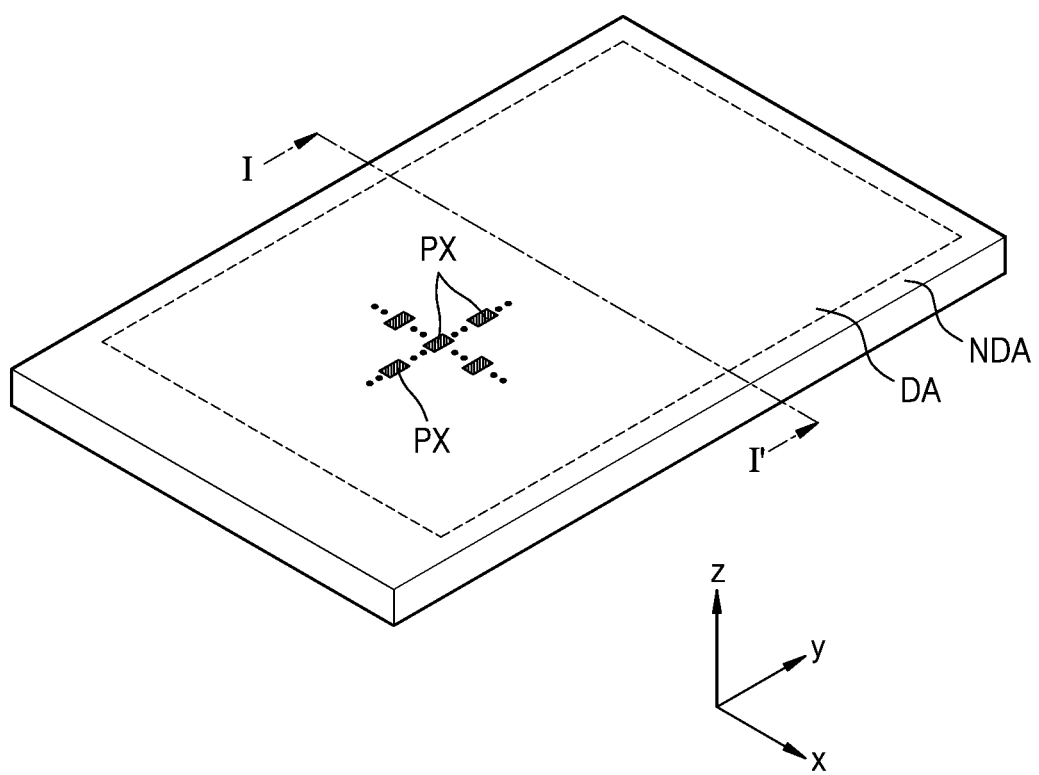
FIG. 1 is a perspective view schematically illustrating a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in more detail in the written description. Effects and features of the disclosure, and methods of achieving them will be clarified with reference to embodiments described below in more detail with reference to the drawings. However, the disclosure is not limited to the following embodiments and the subject matter of the present disclosure may be embodied in various forms.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Also, sizes of elements in the drawings may be exaggerated or reduced for convenience of explanation. In addition, because sizes and thicknesses of elements in the drawings may be arbitrarily illustrated for convenience of explanation, the disclosure is not limited thereto.

In this specification, the expression "A and/or B" indicates only A, only B, or both A and B. Throughout the disclosure, the expression "at least one of A and B" indicates only A, only B, or both A and B.

In the following embodiments, the expression "a line extends in a first direction or a second direction" may include a case in which "a line extends in a linear shape" and a case in which "a line extends in a zigzag or curved shape in a first direction or a second direction."

In the following embodiments, the term "in a plan view" means seeing a target portion from above, and the term "in a cross-sectional view" means seeing a vertically cut cross-section of a target portion from a side. In the following embodiments, the term "overlapping" may include overlapping "in a plan view" and/or "in a cross-sectional view."

Hereinafter, embodiments will be described in more detail with reference to the accompanying drawings. When describing embodiments with reference to the accompanying drawings, the same or corresponding elements are denoted by the same reference numerals.

FIG. 1 is a perspective view schematically illustrating a display apparatus 1 according to an embodiment.

Referring to FIG. 1, the display apparatus 1 according to an embodiment may include a display area DA and a non-display area NDA outside the display area DA. Although FIG. 1 illustrates that the display area DA has a rectangular shape, the disclosure is not limited thereto. The display area DA may have various suitable shapes such as a circular shape, an elliptical shape, or a polygonal shape.

The display area DA is an area that displays an image, and a plurality of sub-pixels PX may be arranged in the display area DA. Each of the sub-pixels PX may include a light-emitting element such as an organic light-emitting diode (OLED). Each of the sub-pixels PX may emit, for example, red light, green light, blue light, or white light.

The display area DA may provide a certain image through light emitted from the sub-pixels PX. As described above, the sub-pixel PX in this specification may be defined as an emission area configured to emit light of any one color selected from among red, green, blue, and white.

The non-display area NDA is an area in which the sub-pixels PX are not arranged and an image is not designed to be provided. Pads connected to a driver integrated circuit (IC) or a printed circuit board including a driving circuit and a power supply line configured to drive the sub-pixels PX may be arranged in the non-display area NDA.

Hereinafter, an organic light-emitting display apparatus will be described as an example of the display apparatus 1 according to an embodiment. However, the display apparatus 1 according to the disclosure is not limited thereto. For example, the display apparatus 1 according to the disclosure may include an inorganic light-emitting display apparatus (or an inorganic electroluminescence (EL) display apparatus) or a quantum dot light-emitting display apparatus. For example, a light-emitting layer included in the light-emitting element included in the display apparatus may include an organic material or an inorganic material. Quantum dots may be positioned on a path of light emitted from the emission layer.

Figure 2:
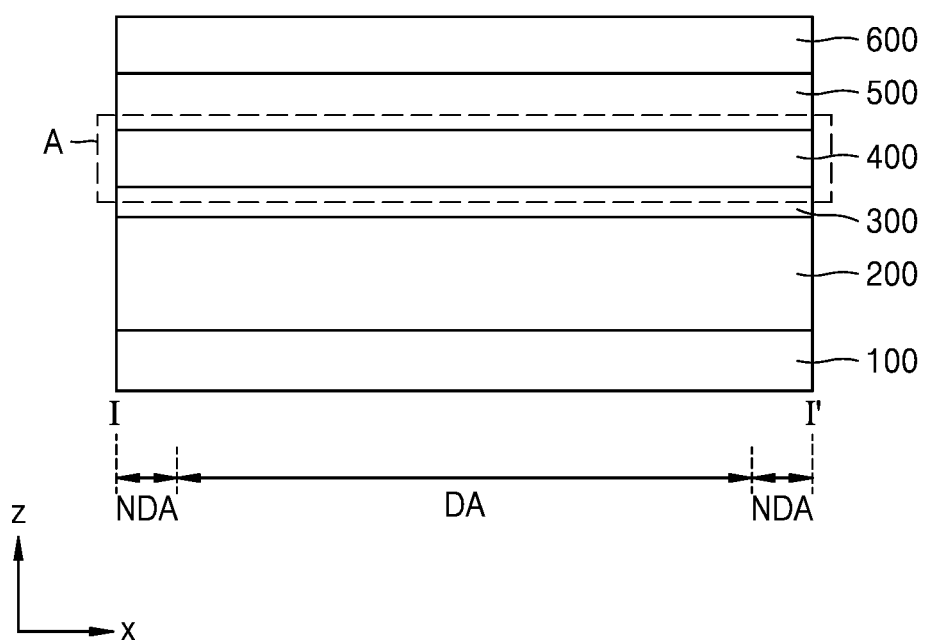
FIG. 2 is a cross-sectional view schematically illustrating a display apparatus according to an embodiment.
Figure 3:
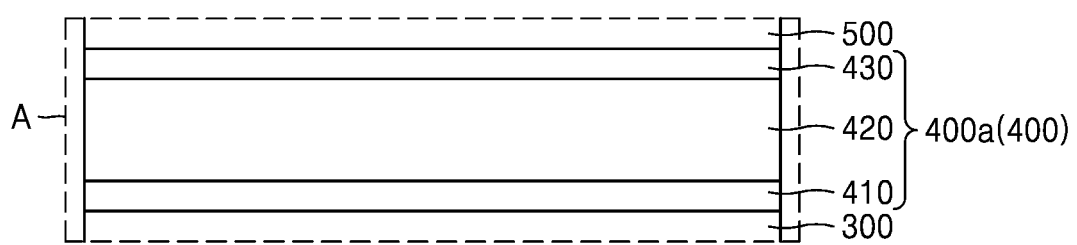
FIGS. 3 and 4 are enlarged cross-sectional views of region A of FIG. 2.
Figure 4:
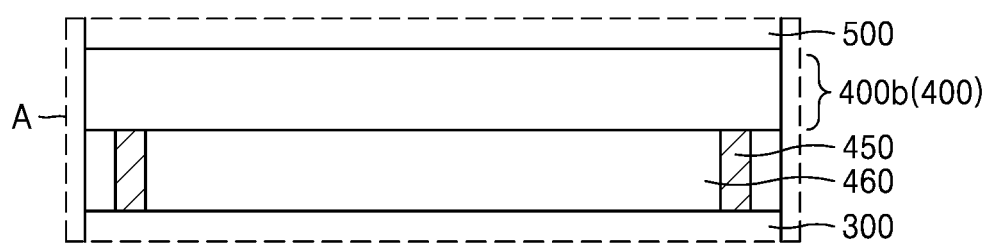

FIG. 2 is a cross-sectional view schematically illustrating a display apparatus 1 according to an embodiment, and FIGS. 3 and 4 are enlarged views of region A of FIG. 2. FIG. 2 is a cross-sectional view of the display apparatus 1 taken along line I-I' of FIG. 1.

Referring to FIGS. 2 to 4, the display apparatus 1 according to an embodiment may include a substrate 100, a display layer 200, a low-reflection layer 300, an encapsulation member 400, a touch sensor layer 500, and an anti-reflective layer 600.

The substrate 100 may include glass and/or a polymer resin. For example, the polymer resin may include polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 including the polymer resin may be flexible, rollable, and/or bendable. The substrate 100 may have a multilayer structure that includes an inorganic layer and a layer including the above-described polymer resin.

The display layer 200 may include an OLED, which is a light-emitting element, a thin-film transistor electrically connected to the OLED, and insulating layers therebetween.

The low-reflection layer 300 may be on the display layer 200, and the encapsulation member 400 may be on the low-reflection layer 300. For example, the display layer 200 and/or the low-reflection layer 300 may be sealed with or by the encapsulation member 400.

As illustrated in FIG. 3, the encapsulation member 400 may include a thin-film encapsulation layer 400a including at least one inorganic layer and at least one organic layer. In some embodiments, the thin-film encapsulation layer 400a may include a first inorganic layer 410, a second inorganic layer 430, and an organic layer 420 therebetween.

The first inorganic layer 410 and the second inorganic layer 430 may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO). The first inorganic layer 410 and the second inorganic layer 430 may have a single-layer structure or a multilayer structure including the above-described inorganic insulating material.

The organic layer 420 may alleviate internal stress of the first inorganic layer 410 and/or the second inorganic layer 430. The organic layer 420 may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate, polyacrylic acid, etc.), or any combination thereof.

The organic layer 420 may be formed by applying a flowable material including monomers and then reacting the monomers so that the monomers are bonded to form a polymer by using heat and/or light such as ultraviolet light. In some embodiments, the organic layer 420 may be formed by applying a polymer material.

Even when cracks occur in the thin-film encapsulation layer 400a through the above-described multilayer structure, the thin-film encapsulation layer 400a may prevent or reduce connection of such cracks between the first inorganic layer 410 and the organic layer 420 or between the organic layer 420 and the second inorganic layer 430. This may prevent, minimize, or reduce the formation of a path through which external moisture and/or oxygen penetrates into the display area DA.

In some embodiments, the encapsulation member 400 may include an encapsulation substrate 400b, as illustrated in FIG. 4. The encapsulation substrate 400b may be on the display layer 200, and the display layer 200 may be between the substrate 100 and the encapsulation substrate 400b. A gap may exist between the encapsulation substrate 400b and the display layer 200. The encapsulation substrate 400b may include glass. A sealant 450 may be between the substrate 100 and the encapsulation substrate 400b. The sealant 450 is arranged in the non-display area NDA and may be provided to surround (e.g., partially or completely surround) the display area DA. Because the sealant 450 is provided along the periphery of the display area DA, the penetration of moisture and/or the like into the display area DA through the side surface of the display apparatus 1 may be prevented, minimized, or reduced.

A filler 460 may be between the low-reflection layer 300 and the encapsulation substrate 400b. The filler 460 may include an epoxy filler, an acrylate filler, and/or an epoxy-acrylate filler.

The touch sensor layer 500 may be on the encapsulation member 400. The touch sensor layer 500 may be configured to sense an external input, for example, a touch of an object such as a finger and/or a stylus pen, so that the display apparatus 1 may obtain coordinate information corresponding to a touch position. The touch sensor layer 500 may include a touch electrode and trace lines connected to the touch electrode. The touch sensor layer 500 may sense an external input by using a mutual cap method or a self cap method.

The touch sensor layer 500 may be on the encapsulation member 400. In some embodiments, the touch sensor layer 500 may be directly on the thin-film encapsulation layer 400a or the encapsulation substrate 400b (e.g., the touch sensor layer 500 may physically contact the thin-film encapsulation layer 400a or the encapsulation substrate 400b). In some embodiments, the touch sensor layer 500 may be separately formed and then adhered to the thin-film encapsulation layer 400a or the encapsulation substrate 400b through an adhesive layer such as an optical transparent adhesive (OCA).

The anti-reflective layer 600 may be on the touch sensor layer 500. The anti-reflective layer 600 may reduce the reflectance of light (external light) incident toward the display apparatus 1.

Figure 5:
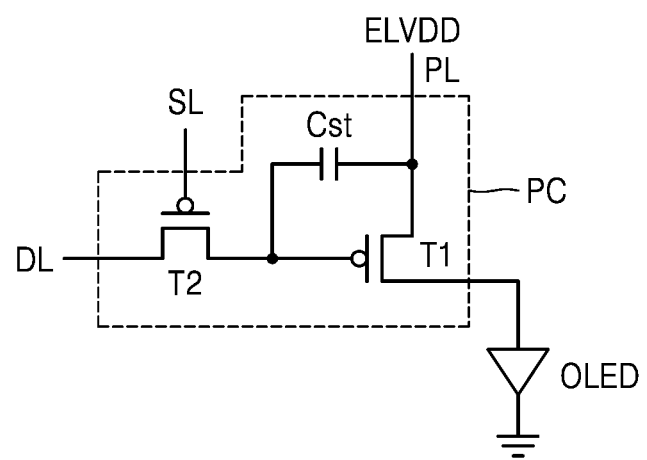
FIG. 5 is an equivalent circuit diagram of a pixel circuit included in a display apparatus, according to an embodiment.

FIG. 5 is an equivalent circuit diagram of a pixel circuit PC included in a display apparatus, according to an embodiment.

Referring to FIG. 5, a light-emitting element OLED may be connected to the pixel circuit PC. The light-emitting element OLED may emit red light, green light, blue light, or white light. The light-emitting element OLED may include an organic light-emitting diode.

The pixel circuit PC may include a first thin-film transistor T1, a second thin-film transistor T2, and a storage capacitor Cst. Each of the first thin-film transistor T1 and the second thin-film transistor T2 may be an oxide semiconductor thin-film transistor including a semiconductor layer including an oxide semiconductor, or a silicon semiconductor thin-film transistor including a semiconductor layer including polysilicon.

The first thin-film transistor T1 may include a driving thin-film transistor. The first thin-film transistor T1 may be connected to a driving voltage line PL and the storage capacitor Cst and may be configured to control a driving current flowing from the driving voltage line PL to the light-emitting element OLED in response to a voltage value stored in the storage capacitor Cst. The light-emitting element OLED may emit light having a set or certain luminance according to the driving current.

The second thin-film transistor T2 may include a switching thin-film transistor. The second thin-film transistor T2 may be connected to a data line DL. The second thin-film transistor T2 may be configured to transmit, to the first thin-film transistor T1, data input from the data line DL in response to a switching voltage input from a scan line SL.

The storage capacitor Cst may be connected to the second thin-film transistor T2 and the driving voltage line PL. The storage capacitor Cst may be configured to store a voltage corresponding to a difference between a voltage received from the second thin-film transistor T2 and a driving voltage ELVDD supplied to the driving voltage line PL.

Although FIG. 5 illustrates that the pixel circuit PC includes two thin-film transistors T1 and T2 and one storage capacitor Cst, the disclosure is not limited thereto. In some embodiments, the pixel circuit PC may include seven thin-film transistors and one storage capacitor. The number of thin-film transistors or the number of storage capacitors may be variously changed according to the design of the pixel circuit PC. For example, the pixel circuit PC may include seven thin-film transistors and two storage capacitors.

Figure 6:
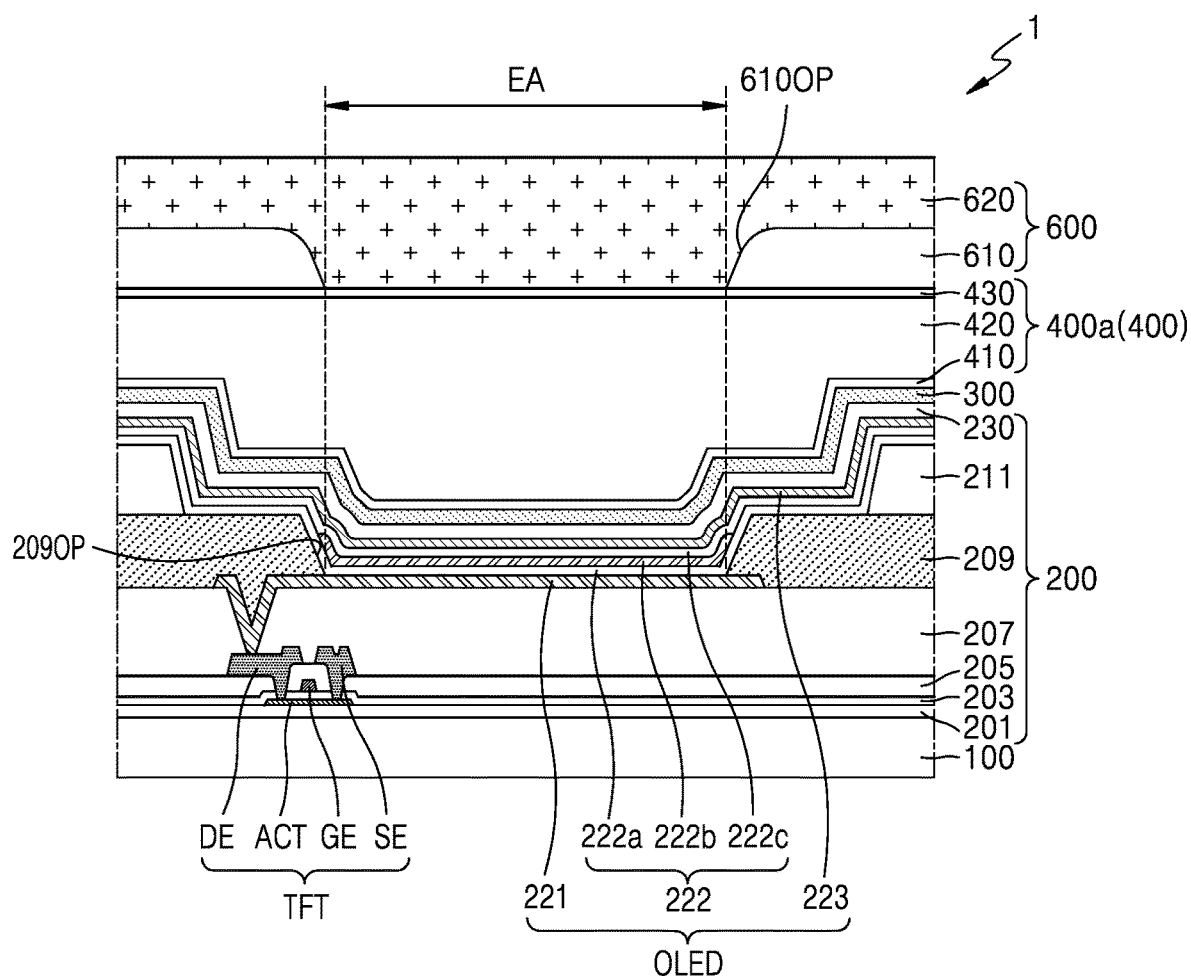
FIG. 6 is a cross-sectional view schematically illustrating a display apparatus according to an embodiment.
Figure 7:
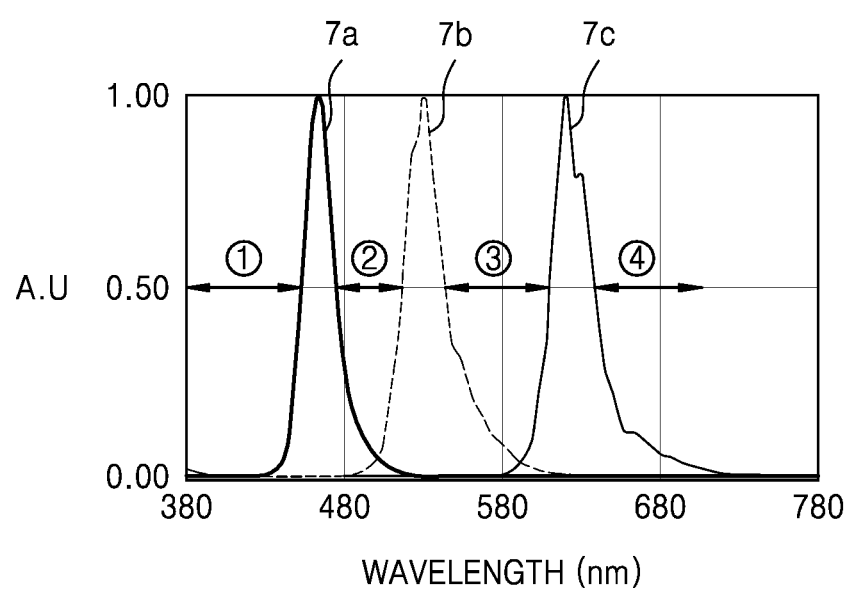
FIG. 7 is a graph illustrating a wavelength band absorbed by a reflection control layer of a display apparatus, according to an embodiment.

FIG. 6 is a cross-sectional view schematically illustrating a display apparatus 1 according to an embodiment, and FIG. 7 is a graph for describing a wavelength band absorbed by a reflection control layer of the display apparatus 1, according to an embodiment.

Referring to FIG. 6, the display apparatus 1 according to an embodiment may include a substrate 100, a display layer 200, a low-reflection layer 300, a thin-film encapsulation layer 400a, and an anti-reflective layer 600.

The display layer 200 may include a buffer layer 201, a gate insulating layer 203, an interlayer insulating layer 205, a planarization layer 207, a pixel defining layer 209, a spacer 211, a light-emitting element OLED, and a thin-film transistor TFT. In some embodiments, the display layer 200 may further include a capping layer 230 on the light-emitting element OLED.

The buffer layer 201 may be on the substrate 100, may reduce or prevent infiltration of foreign material, moisture, and/or ambient air from below the substrate 100, and may provide a flat surface on the substrate 100. The buffer layer 201 may include an inorganic material such as an oxide and/or a nitride, an organic material, and/or an organic/inorganic composite material, and may have a single-layer structure or a multilayer structure including an inorganic material and an organic material. A barrier layer that prevents or reduces infiltration of ambient air may be further included between the substrate 100 and the buffer layer 201. The buffer layer 201 may include silicon oxide ($SiO_2$) and/or silicon nitride (SiNx).

The thin-film transistor TFT may be on the buffer layer 201. The thin-film transistor TFT may include a semiconductor layer ACT, a gate electrode GE, a source electrode SE, and a drain electrode DE. The thin-film transistor TFT may be connected to the light-emitting element OLED and may be configured to drive the light-emitting element OLED.

The semiconductor layer ACT may be on the buffer layer 201 and may include polysilicon. In some embodiments, the semiconductor layer ACT may include amorphous silicon. In some embodiments, the semiconductor layer ACT may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer ACT may include a channel region, and a source region and a drain region doped with impurities.

The gate electrode GE, the source electrode SE, and the drain electrode DE may include various suitable conductive materials (e.g., electrically conductive materials). The gate electrode GE may include at least one material selected from molybdenum, aluminum, copper, and titanium. For example, the gate electrode GE may have a single molybdenum layer or a three-layer structure including a molybdenum layer, an aluminum layer, and a molybdenum layer. The source electrode SE and the drain electrode DE may include at least one material selected from copper, titanium, and aluminum. For example, the source electrode SE and the drain electrode DE may have a three-layer structure including a titanium layer, an aluminum layer, and a titanium layer.

In order to secure insulation between the semiconductor layer ACT and the gate electrode GE, the gate insulating layer 203 including an inorganic material such as silicon oxide, silicon nitride, and/or silicon oxynitride may be between the semiconductor layer ACT and the gate electrode GE. Also, the interlayer insulating layer 205 including an inorganic material such as silicon oxide, silicon nitride, and/or silicon oxynitride may be on the gate electrode GE, and the source electrode SE and the drain electrode DE may be on the interlayer insulating layer 205. The interlayer insulating layer 205 including the inorganic material may be formed through chemical vapor deposition (CVD) and/or atomic layer deposition (ALD). The same may apply to embodiments to be further described herein below.

The planarization layer 207 may be on the thin-film transistor TFT. After the planarization layer 207 is formed, chemical mechanical polishing may be performed on the planarization layer 117 so as to provide a flat upper surface. The planarization layer 207 may include a general-purpose polymer (e.g., photosensitive polyimide, polyimide, polystyrene (PS), polycarbonate, benzocyclobutene (BCB), hexamethyldisiloxane (HMDSO), polymethylmethacrylate (PMMA), etc.), a polymer derivative having a phenol-based group, an acrylic polymer, an imide-based polymer, an aryl ether-based polymer, an amide-based polymer, a fluorine-based polymer, a p-xylene-based polymer, and/or a vinyl alcohol-based polymer. Although FIG. 6 illustrates that the planarization layer 207 is a single layer, the planarization layer 207 may be multiple layers.

The light-emitting element OLED may be on the planarization layer 207. The light-emitting element OLED may include an organic light-emitting diode. The light-emitting element OLED may include a pixel electrode 221, an intermediate layer 222, and an opposite electrode 223.

The pixel electrode 221 may be on the planarization layer 207. The pixel electrode 221 may be arranged for each sub-pixel PX. Pixel electrodes 221 corresponding to neighboring sub-pixels PX may be spaced apart from each other.

The pixel electrode 221 may include a reflective electrode. In some embodiments, the pixel electrode 221 may include a reflective layer and a transparent or semitransparent electrode layer on the reflective layer. The reflective layer may include silver (Ag), magnesium (Mg), aluminum (Al), platinum (Pt), palladium (Pd), gold (Au), nickel (Ni), neodymium (Nd), iridium (Ir), chromium (Cr), and/or any compound thereof. The transparent or semitransparent electrode layer may include at least one material selected from indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 221 may have a structure in which ITO/Ag/ITO are stacked.

The pixel defining layer 209 may be on the pixel electrode 210. The pixel defining layer 209 may include an opening 2090P exposing the central portion of the pixel electrode 221. The pixel defining layer 209 may cover the edge of the pixel electrode 221, and may prevent or reduce an electric arc and/or the like from occurring on the edge of the pixel electrode 221 by increasing the distance between the edge of the pixel electrode 221 and the opposite electrode 223.

The pixel defining layer 209 may include an organic insulating material. In some embodiments, the pixel defining layer 209 may include an inorganic insulating material such as silicon nitride, silicon oxynitride, and/or silicon oxide. In some embodiments, the pixel defining layer 209 may include an organic insulating material and an inorganic insulating material. In some embodiments, the pixel defining layer 209 may include a light blocking material and may be provided in black. The light blocking material may include carbon black, carbon nanotubes, a resin and/or a paste including black dye, metal particles, for example, nickel, aluminum, molybdenum, and/or any alloy thereof, metal oxide particles (e.g., chromium oxide, etc.), and/or metal nitride particles (e.g., chromium nitride, etc.). When the pixel defining layer 209 includes a light blocking material, the reflection of external light due to metal structures under the pixel defining layer 209 may be reduced.

The spacer 211 may be on the pixel defining layer 209. The spacer 211 may include an organic insulating material such as polyimide. In some embodiments, the spacer 211 may include an inorganic insulating material such as silicon nitride (SiNx) and/or silicon oxide ($SiO_2$), and/or may include an organic insulating material and an inorganic insulating material.

In some embodiments, the spacer 211 may include the same (or substantially the same) material as that of the pixel defining layer 209. In this case, the pixel defining layer 209 and the spacer 211 may be formed together in a mask process using a half-tone mask and/or the like. In some embodiments, the pixel defining layer 209 and the spacer 211 may include different materials from each other.

The intermediate layer 222 may be on the pixel electrode 221 and the pixel defining layer 209. The intermediate layer 222 may include a first common layer 222a, an emission layer 222b, and a second common layer 222c.

The emission layer 222b may be inside the opening 2090P of the pixel defining layer 209. The emission layer 222b may include an organic material including a fluorescent and/or phosphorescent material capable of emitting blue light, green light, or red light. The organic material may include a low molecular weight organic material and/or a high molecular weight organic material.

The first common layer 222a and the second common layer 222c may be below and above the emission layer 222b, respectively. The first common layer 222a may include, for example, a hole transport layer (HTL), or may include an HTL and a hole injection layer (HIL). The second common layer 222c may include, for example, an electron transport layer (ETL), or may include an ETL and an electron injection layer (EIL). In some embodiments, the second common layer 222c may not be provided.

The emission layer 222b is arranged for each sub-pixel PX to correspond to the opening 2090P of the pixel defining layer 209, and the first common layer 222a and the second common layer 222c may be provided as one body (e.g., a sole body or unitary body) to completely cover the substrate 100. For example, the first common layer 222a and the second common layer 222c may be provided as one body (e.g., a sole body or unitary body) to completely cover the display area DA of the substrate 100.

The opposite electrode 223 may be a cathode that is an EIL. The opposite electrode 223 may include a conductive material (e.g., an electrically conductive material) having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or any alloy thereof. In some embodiments, the opposite electrode 223 may further include a layer such as ITO, IZO, ZnO, and/or $In_2O_3$ on the (semi)transparent layer including the above-described material. The layers from the pixel electrode 221 to the opposite electrode 223 may constitute the light-emitting element OLED.

In some embodiments, the display apparatus 1 may further include a capping layer 230 on the light-emitting element OLED. The capping layer 230 may improve the luminescence efficiency of the light-emitting element OLED according to the principle of constructive interference. The capping layer 230 may include, for example, a material having a refractive index of 1.6 or greater with respect to light having a wavelength of 589 nm.

The capping layer 230 may include an organic capping layer including an organic material, an inorganic capping layer including an inorganic material, or a composite capping layer including an organic material and an inorganic material. For example, the capping layer 230 may include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compounds, the heterocyclic compounds, and the amine group-containing compounds may optionally be substituted with substituents including O, N, S, Se, Si, F, Cl, Br, I, or any combination thereof.

The low-reflection layer 300 may be on the capping layer 230. Because the capping layer 230 may be on the light-emitting element OLED, it may be said that the low-reflection layer 300 is on the light-emitting element OLED. The low-reflection layer 300 may include an inorganic material having low reflectance. The low-reflection layer 300 may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof. The inorganic material included in the low-reflection layer 300 may have an absorption coefficient of 0.5 or greater. In some embodiments, the inorganic material included in the low-reflection layer 300 may have a refractive index of 1 or greater.

The low-reflection layer 300 may reduce the reflectance of external light by inducing destructive interference between light incident into the display apparatus 1 and light reflected from the metal below the low-reflection layer 300. Therefore, the display quality and visibility of the display apparatus 1 may be improved by reducing the reflectance of external light through the low-reflection layer 300.

The thin-film encapsulation layer 400a, which is the encapsulation member 400, may be on the low-reflection layer 300. As described above, the thin-film encapsulation layer 400a may include at least one inorganic layer and at least one organic layer. For example, the thin-film encapsulation layer 400a may include a first inorganic layer 410, an organic layer 420, and a second inorganic layer 430, which are sequentially stacked.

In some embodiments, when the thin-film encapsulation layer 400a is on the light-emitting element OLED, the substrate 100 may include a polymer resin. However, the disclosure is not limited thereto.

The anti-reflective layer 600 may be on the thin-film encapsulation layer 400a. The anti-reflective layer 600 may include a light blocking layer 610 and a reflection control layer 620.

In some embodiments, the light blocking layer 610 may include an opening 610OP corresponding to an emission area EA of the light-emitting element OLED. In some embodiments, the width of the opening 610OP defined in the light blocking layer 610 may be equal to the width of the opening 2090P defined in the pixel defining layer 209. However, the disclosure is not limited thereto. In some embodiments, the width of the opening 610OP defined in the light blocking layer 610 may be greater than the width of the opening 2090P defined in the pixel defining layer 209. For example, the area of the opening 610OP defined in the light blocking layer 610 may be greater than the area of the opening 2090P defined in the pixel defining layer 209. In some embodiments, the width of the opening 610OP defined in the light blocking layer 610 may be less than the width of the opening 2090P defined in the pixel defining layer 209.

In some embodiments, the light blocking layer 610 may include a light blocking material and may be provided in black. The light blocking material may include carbon black, carbon nanotubes, a resin and/or a paste including black dye, metal particles, for example, nickel, aluminum, molybdenum, and/or any alloy thereof, metal oxide particles (e.g., chromium oxide, etc.), and/or metal nitride particles (e.g., chromium nitride, etc.). When the light blocking layer 610 includes a light blocking material, the reflection of external light due to metal structures under the light blocking layer 610 may be reduced. For example, the light blocking layer 610 may include the same (or substantially the same) material as that of the pixel defining layer 209 therebelow. However, the disclosure is not limited thereto. The light blocking layer 610 may include a material different from that of the pixel defining layer 209.

In some embodiments, the reflection control layer 620 may be on the light blocking layer 610. For example, the reflection control layer 620 may fill the opening 610OP of the light blocking layer 610.

FIG. 7 is a graph illustrating wavelength bands of blue light 7a, green light 7b, and red light 7c and a wavelength band absorbed by the reflection control layer 620 of the display apparatus 1 according to an embodiment.

Referring to FIGS. 6 and 7, the light-emitting element OLED of the display apparatus 1 according to the embodiment may emit red light, green light, blue light, or white light. In some embodiments, the maximum peak wavelength of the blue light 7a may be about 460 nm, the maximum peak wavelength of the green light 7b may be about 530 to 540 nm, and the maximum peak wavelength of the red light 7c may be about 630 nm.

In some embodiments, the reflection control layer 620 may be configured to absorb light in at least three wavelength bands selected from a first wavelength band of 430 nm or less (band 1), a second wavelength band of 480 nm to 510 nm (band 2), a third wavelength band of 575 nm to 605 nm (band 3), and a fourth wavelength band of 650 nm or greater (band 4).

In some embodiments, the reflection control layer 620 may be configured to absorb light in at least three wavelength bands selected from a first wavelength band having a maximum absorption wavelength of 430 nm or less, a second wavelength band having a maximum absorption wavelength of 480 nm to 510 nm, a third wavelength band having a maximum absorption wavelength of 575 nm to 605 nm, and a fourth wavelength band having a maximum absorption wavelength of 650 nm or greater.

For example, the reflection control layer 620 may be configured to absorb light in the first to third wavelength bands, may be configured to absorb light in the first, second, and fourth wavelength bands, may be configured to absorb light in the first, third, and fourth wavelength bands, or may be configured to absorb light in the second to fourth wavelength bands. In some embodiments, the reflection control layer 620 may be configured to absorb light in the first to fourth wavelength bands.

In some embodiments, the reflection control layer 620 may be configured to absorb light having a wavelength that does not belong to the red, green, or blue wavelength band of the light-emitting element OLED. The reflection control layer 620 is configured to absorb light in a set or certain wavelength band among pieces (or portions) of light incident from the outside of the display apparatus 1, or is configured to absorb light in a set or certain wavelength band among pieces (or portions) of light after the light incident from the outside of the display apparatus 1 is reflected by the electrodes of the display layer 200, thereby improving visibility of the display apparatus 1.

In some embodiments, when the reflection control layer 620 is configured to absorb light having a wavelength of greater than 430 nm and less than 480 nm, light having a wavelength corresponding to the blue light 7a may be absorbed so that the luminance of the blue light 7a emitted from the light-emitting element OLED decreases. Therefore, the luminescence efficiency of the display apparatus 1 may deteriorate. In some embodiments, when the reflection control layer 620 is configured to absorb light having a wavelength of greater than 510 nm and less than 575 nm, light having a wavelength corresponding to the green light 7b may be absorbed so that the luminance of the green light 7b emitted from the light-emitting element OLED decreases. Therefore, the luminescence efficiency of the display apparatus 1 may deteriorate. In some embodiments, when the reflection control layer 620 is configured to absorb light having a wavelength of greater than 605 nm and less than 650 nm, light having a wavelength corresponding to the red light 7c may be absorbed so that the luminance of the red light 7c emitted from the light-emitting element OLED decreases. Therefore, the luminescence efficiency of the display apparatus 1 may deteriorate.

Therefore, the reflection control layer 620 is configured to absorb light having a wavelength that does not belong to the red, green, or blue wavelength band of the light-emitting element OLED, thereby preventing, minimizing, or reducing a decrease in the luminance of the display apparatus 1, preventing or reducing a decrease in the luminescence efficiency of the display apparatus 1, and improving the visibility of the display apparatus 1.

In some embodiments, the reflection control layer 620 may include an organic material layer including a dye, a pigment, or any combination thereof. The reflection control layer 620 may include a porphyrin-based dye, a metal Porphyrin-based dye, a methine-based dye, a triazine-based dye, a dipyrromethene-based dye, a tetra aza porphyrin (TAP)-based dye, a phthalocyanine-based dye, an oxazine-based dye, a cyanine-based dye, a squarylium-based dye, or any combination thereof.

In some embodiments, because the reflection control layer 620 is able to absorb light in at least three wavelength bands selected from the first to fourth wavelength bands, the reflection control layer 620 may include at least three selected from a first light absorbing material that absorbs light in the first wavelength band, a second light absorbing material that absorbs light in the second wavelength band, a third light absorbing material that absorbs light in the third wavelength band, and a fourth light absorbing material that absorbs light in the fourth wavelength band.

In some embodiments, each of the first light absorbing material, the second light absorbing material, the third light absorbing material, and the fourth light absorbing material may include a dye, a pigment, or any combination thereof.

In some embodiments, when the reflection control layer 620 is configured to absorb light in the first wavelength band, the reflection control layer 620 may include at least one material selected from a metal porphyrin-based dye, a methine-based dye, and a triazine-based dye. For example, the first light absorbing material may include at least one material selected from a metal porphyrin-based dye, a methine-based dye, and a triazine-based dye. However, the disclosure is not limited thereto.

In some embodiments, the amount of the first light absorbing material included in the reflection control layer 620 may be 0.005 wt % to 5 wt %, based on 100 wt % of the reflection control layer 620. When the amount of the first light absorbing material included in the reflection control layer 620 is less than 0.005 wt %, the light absorption in the first wavelength band may be low (e.g., unsuitably low), and when the amount of the first light absorbing material included in the reflection control layer 620 is greater than 5 wt %, the first light absorbing material may not be well dissolved in a solvent. Therefore, because the amount of the first light absorbing material included in the reflection control layer 620 is 0.005 wt % to 5 wt %, the reflection control layer 620 is configured to absorb the light in the first wavelength band to improve the visibility of the display apparatus.

In some embodiments, when the reflection control layer 620 is configured to absorb the light in the second wavelength band, the reflection control layer 620 may include a dipyrromethene-based dye. For example, the second light absorbing material may include a dipyrromethene-based dye. However, the disclosure is not limited thereto.

In some embodiments, the amount of the second light absorbing material included in the reflection control layer 620 may be 0.005 wt % to 5 wt %, based on 100 wt % of the reflection control layer 620. When the amount of the second light absorbing material included in the reflection control layer 620 is less than 0.005 wt %, the light absorption in the second wavelength band may be low (e.g., unsuitably low), and when the amount of the second light absorbing material included in the reflection control layer 620 is greater than 5 wt %, the second light absorbing material may not be well dissolved in a solvent. Therefore, because the amount of the second light absorbing material included in the reflection control layer 620 is 0.005 wt % to 5 wt %, the reflection control layer 620 is configured to absorb the light in the second wavelength band to improve the visibility of the display apparatus.

In some embodiments, when the reflection control layer 620 is configured to absorb the light in the third wavelength band, the reflection control layer 620 may include a TAP-based dye. For example, the third light absorbing material may include a TAP-based dye. However, the disclosure is not limited thereto.

In some embodiments, the amount of the third light absorbing material included in the reflection control layer 620 may be 0.005 wt % to 5 wt % based on 100 wt % of the reflection control layer 620. When the amount of the third light absorbing material included in the reflection control layer 620 is less than 0.005 wt %, the light absorption in the third wavelength band may be low (e.g., unsuitably low), and when the amount of the third light absorbing material included in the reflection control layer 620 is greater than 5 wt %, the third light absorbing material may not be well dissolved in a solvent. Therefore, because the amount of the third light absorbing material included in the reflection control layer 620 is 0.005 wt % to 5 wt %, the reflection control layer 620 is configured to absorb the light in the third wavelength band to improve the visibility of the display apparatus.

In some embodiments, when the reflection control layer 620 is configured to absorb the light in the fourth wavelength band, the reflection control layer 620 may include a phthalocyanine-based dye. For example, the fourth light absorbing material may include a phthalocyanine-based dye. However, the disclosure is not limited thereto.

In some embodiments, the amount of the fourth light absorbing material included in the reflection control layer 620 may be 0.005 wt % to 5 wt % based on 100 wt % of the reflection control layer 620. When the amount of the fourth light absorbing material included in the reflection control layer 620 is less than 0.005 wt %, the light absorption in the fourth wavelength band may be low (e.g., unsuitably low), and when the amount of the fourth light absorbing material included in the reflection control layer 620 is greater than 5 wt %, the fourth light absorbing material may not be well dissolved in a solvent. Therefore, because the amount of the fourth light absorbing material included in the reflection control layer 620 is 0.005 wt % to 5 wt %, the reflection control layer 620 is configured to absorb the light in the fourth wavelength band to improve the visibility of the display apparatus.

In some embodiments, when the reflection control layer 620 is configured to absorb the light in the first wavelength band, the first light absorbing material may include a compound represented by one of Formulae 1 and 2 below.

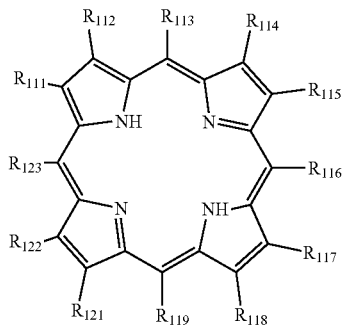

Formula 1

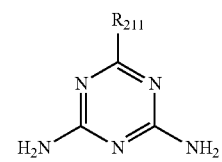

Formula 2

In some embodiments, when the reflection control layer 620 is configured to absorb the light in the second wavelength band, the second light absorbing material may include a compound represented by Formula 3 below.

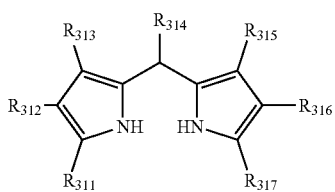

Formula 3

In some embodiments, when the reflection control layer 620 is configured to absorb the light in the third wavelength band, the third light absorbing material may include a compound represented by Formula 4 below.

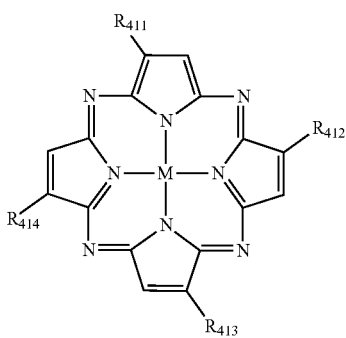

Formula 4

In some embodiments, when the reflection control layer 620 is configured to absorb the light in the fourth wavelength band, the fourth light absorbing material may include a compound represented by Formula 5 below.

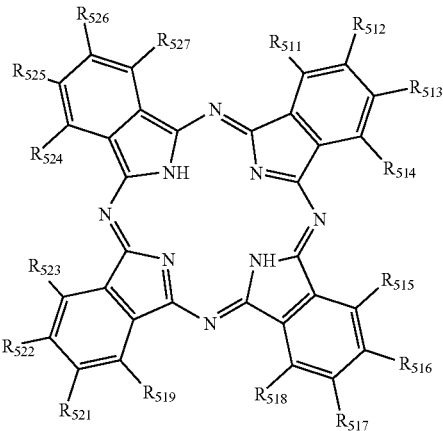

Formula 5

In Formulae 1 to 5, M is a metal, and $R_{111}$, $R_{112}$, $R_{113}$, $R_{114}$, $R_{115}$, $R_{116}$, $R_{117}$, $R_{118}$, $R_{119}$, $R_{121}$, $R_{122}$, $R_{123}$, $R_{211}$, $R_{311}$, $R_{312}$, $R_{313}$, $R_{314}$, $R_{315}$, $R_{316}$, $R_{317}$, $R_{411}$, $R_{412}$, $R_{413}$, $R_{414}$, $R_{511}$, $R_{512}$, $R_{513}$, $R_{514}$, $R_{515}$, $R_{516}$, $R_{517}$, $R_{518}$, $R_{519}$, $R_{521}$, $R_{522}$, $R_{523}$, $R_{524}$, $R_{525}$, $R_{526}$, and $R_{527}$ may be identical to or different from each other, and may each include: hydrogen, deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, Si($Q21$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be selected from: hydrogen; heavy hydrogen; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In some embodiments, because the reflection control layer 620 is able to absorb light in at least three wavelength bands selected from the first to fourth wavelength bands, the reflection control layer 620 may include at least three compounds selected from the compounds represented by Formulae 1 to 5.

In some embodiments, the reflection control layer 620 may include, as the first light absorbing material, Tinuvin 970 (brand name, manufactured by BASF), FDB-001 (trade name, manufactured by Yamada Kagaku Kogyo Co., Ltd.), FDB-002 (brand name, manufactured by Yamada Kagaku Kogyo Co., Ltd.), and/or the like. However, the disclosure is not limited thereto. The reflection control layer 620 may include various suitable dyes that absorb light in the first wavelength band of 430 nm or less.

In some embodiments, the reflection control layer 620 may include, as the second light absorbing material, VD-500 (brand name, manufactured by Wooksung Chemical), FDB-022 (brand name, manufactured by Yamada Kagaku Kogyo Co., Ltd.), and/or the like. However, the disclosure is not limited thereto. The reflection control layer 620 may include various suitable dyes that absorb light in the second wavelength band of 480 nm to 510 nm.

In some embodiments, the reflection control layer 620 may include, as the third light absorbing material, NEC-594 (brand name, manufactured by Wooksung Chemical), SDK-001 (brand name, manufactured by Kyung In Corporation), FDG-006 (brand name, manufactured by Yamada Chemical Industries, Ltd.), FDG-007 (brand name, manufactured by Yamada Chemical Industries, Ltd.), FDG-024 (brand name, manufactured by Yamada Kagaku Kogyo Co., Ltd.), FDR-001 (brand name, manufactured by Yamada Kagaku Kogyo Co., Ltd.), and/or the like. However, the disclosure is not limited thereto. The reflection control layer 620 may include various suitable dyes that absorb light in the third wavelength band of 575 nm to 605 nm.

In some embodiments, the reflection control layer 620 may include, as the fourth light absorbing material, FDR-001 (brand name, manufactured by Yamada Kagaku Kogyo Co., Ltd.), FDR-002 (brand name, manufactured by Yamada Kagaku Kogyo Co., Ltd.), and/or the like. However, the disclosure is not limited thereto. The reflection control layer 620 may include various suitable dyes that absorb light in the fourth wavelength band of 650 nm or greater.

In some embodiments, the reflection control layer 620 may include three light absorbing materials selected from the first to fourth light absorbing materials, a base polymer, a solvent, a photoinitiator, and an additive.

In some embodiments, the base polymer may include an acrylate-based polymer and/or an epoxy. However, the disclosure is not limited thereto. Any suitable polymer may be employed as the base polymer. In some embodiments, the solvent may include at least one material selected from propylene glycol mono ether acetate (PGMEA), propylene glycol methyl ether (PGME), and ethyl 3-ethoxypropionate (EEP). However, the disclosure is not limited thereto. Any suitable material may be employed as the solvent.

The photoinitiator may include at least one material selected from a benzophenone photoinitiator, a benzotriazole photoinitiator, and an oxime ester photoinitiator. However, the disclosure is not limited thereto. Any suitable material may be employed as the photoinitiator. In some embodiments, the additive may include a fluorine (F)-based additive and/or a silicon (Si)-based additive. However, the disclosure is not limited thereto. Any suitable material may be employed as the additive.

In some embodiments, the reflection control layer 620 may include 0.005 wt % to 5 wt % of each of the three light absorbing materials selected from the first to fourth light absorbing materials, 15 wt % to 30 wt % of the base polymer, 60 wt % to 85 wt % of the solvent, 0 wt % (including 0) to 7 wt % of the photoinitiator, and 0 wt % (including 0) to 5 wt % of the additive, based on 100 wt % of the reflection control layer 620. In some embodiments, the reflection control layer 620 may include 0.01 wt % to 1.5 wt % of the pigment.

In some embodiments, because the reflection control layer 620 is configured to absorb light in at least three wavelength bands selected from the first wavelength band having a maximum absorption wavelength of 430 nm or less, the second wavelength band having a maximum absorption wavelength of 480 nm to 510 nm, the third wavelength band having a maximum absorption wavelength of 575 nm to 605 nm, and the fourth wavelength band having a maximum absorption wavelength of 650 nm or greater, the display apparatus 1 in which light efficiency is improved by absorbing light having a wavelength out of the red, green, or blue light emission wavelength bands of the light-emitting element may be implemented.

Figure 8:
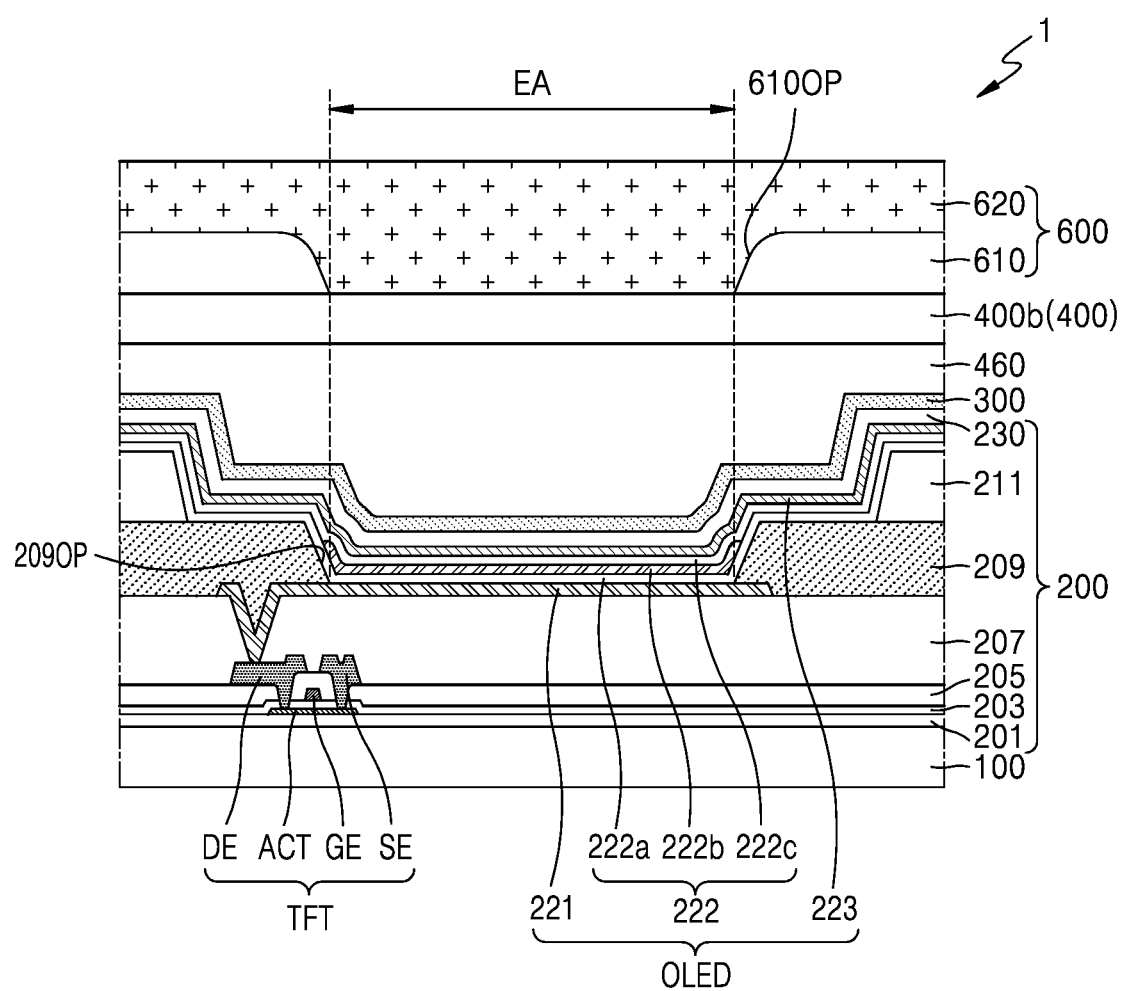
FIG. 8 is a cross-sectional view schematically illustrating a display apparatus according to an embodiment.

FIG. 8 is a cross-sectional view schematically illustrating a display apparatus 1 according to an embodiment. The embodiment of FIG. 8 differs from the embodiment of FIG. 6 in that an encapsulation substrate 400*b* is provided as the encapsulation member 400. In FIG. 8, the same reference numerals as those in FIG. 6 denote the same members, and redundant descriptions thereof may not be repeated here.

Referring to FIG. 8, the encapsulation substrate 400*b* as the encapsulation member 400 may be on a display layer 200. A low-reflection layer 300 and a filler 460 may be between the display layer 200 and the encapsulation substrate 400*b*.

In some embodiments, the encapsulation substrate 400*b* may include glass. When the encapsulation substrate 400*b* includes glass, a substrate 100 may also include glass. The filler 460 may include an epoxy filler, an acrylate filler, and/or an epoxy-acrylate filler.

The encapsulation substrate 400*b* may be on the substrate 100 by bonding the encapsulation substrate 400*b* to the substrate 100 on which the display layer 200 and/or the low-reflection layer 300 are arranged. Therefore, an air gap may exist between the substrate 100 and the encapsulation substrate 400*b*. For example, an air gap may exist between the low-reflection layer 300 and the encapsulation substrate 400*b*. Light (external light) incident onto the display apparatus 1 may be reflected from an interface between the low-reflection layer 300 and the air gap and an interface between the air gap and the encapsulation substrate 400*b*. Therefore, the reflectance with respect to the external light increases, and the visibility of the display apparatus 1 may deteriorate.

In some embodiments, because the filler 460 including the epoxy filler, the acrylate filler, the epoxy-acrylate filler, and/or the like is between the low-reflection layer 300 and the encapsulation substrate 400*b*, the reflection of the light (external light) incident onto the display apparatus 1 from the interface between the low-reflection layer 300 and the air gap and the interface between the air gap and the encapsulation substrate 400*b* may be prevented, minimized, or reduced. Therefore, because the filler 460 is between the low-reflection layer 300 and the encapsulation substrate 400*b*, the reflectance of the display apparatus 1 with respect to the external light may be reduced and the visibility of the display apparatus 1 may be improved.

Figure 9:
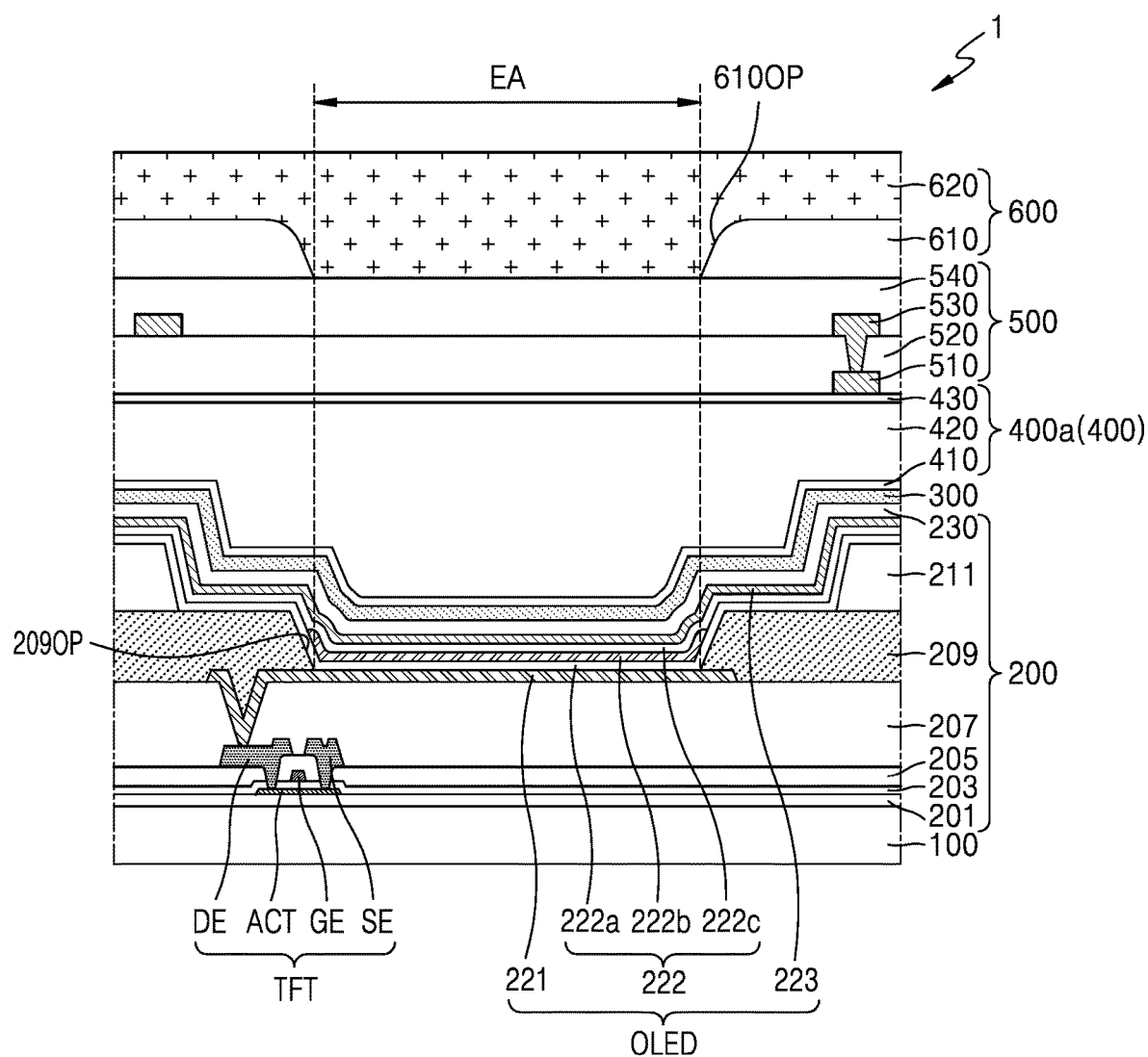
FIG. 9 is a cross-sectional view schematically illustrating a display apparatus according to an embodiment.

FIG. 9 is a cross-sectional view schematically illustrating a display apparatus 1 according to an embodiment. The embodiment of FIG. 9 differs from the embodiment of FIG. 6 in that a touch sensor layer 500 is between an encapsulation member 400 and an anti-reflective layer 600. In FIG. 9, the same reference numerals as those in FIG. 6 denote the same members, and redundant descriptions thereof may not be repeated here.

Referring to FIG. 9, the touch sensor layer 500 may be between the encapsulation member 400 and the anti-reflective layer 600. The touch sensor layer 500 may be configured to sense a user touch input. The touch sensor layer 500 may be configured to sense a user touch input by using a resistive method, a capacitive method, and/or the like.

The touch sensor layer 500 may be on a thin-film encapsulation member 400a. The touch sensor layer 500 may include a first conductive layer 510, a first touch insulating layer 520, a second conductive layer 530, and a second touch insulating layer 540.

In some embodiments, the first conductive layer 510 may be directly on (e.g., may physically contact) the encapsulation member 400. When the thin-film encapsulation layer 400a is provided as the encapsulation member 400, the first conductive layer 510 may be directly on (e.g., may physically contact) a second inorganic layer 430 of the thin-film encapsulation layer 400a. However, the disclosure is not limited thereto. An insulating layer may be additionally between the second inorganic layer 430 and the first conductive layer 510. In some embodiments, the insulating layer may include an inorganic insulating material such as silicon oxide ($SiO_2$), silicon nitride (SiNx), silicon oxynitride (SiON), and/or the like. In some embodiments, the insulating layer may include an organic insulating material.

In some embodiments, the first touch insulating layer 520 may be on the first conductive layer 510. The first touch insulating layer 520 may include an inorganic material and/or an organic material. When the first touch insulating layer 520 includes an inorganic material, the first touch insulating layer 520 may include at least one material selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. When the first touch insulating layer 520 includes an organic material, the first touch insulating layer 520 may include at least one material selected from an acrylic resin, a methacrylic resin, polyisoprene, a vinyl-based resin, an epoxy-based resin, a urethane-based resin, a cellulose-based resin, and a perylene-based resin.

In some embodiments, the second conductive layer 530 may be on the first touch insulating layer 520. The second conductive layer 530 may act as a sensor configured to sense a user touch input. The first conductive layer 510 may act as a connector connecting the patterned second conductive layer 530 in one direction. In some embodiments, both the first conductive layer 510 and the second conductive layer 530 may act as a sensor. In this case, the first conductive layer 510 and the second conductive layer 530 may be electrically connected to each other through a contact hole. As both the first conductive layer 510 and the second conductive layer 530 act as a sensor, the resistance of the touch electrode is reduced, so that a user touch input may be quickly sensed. In some embodiments, the first conductive layer 510 and the second conductive layer 530 may have a mesh structure that allows light emitted from the light-emitting element OLED to pass therethrough. In this case, the first conductive layer 510 and the second conductive layer 530 may be arranged not to overlap an emission area EA of the light-emitting element OLED.

The first conductive layer 510 and the second conductive layer 530 may include a metal layer and/or a transparent conductive layer. The metal layer may include molybdenum (Mo), silver (Ag), titanium (Ti), copper (Cu), aluminum (Al), and/or any alloy thereof. The transparent conductive layer may include a transparent conductive oxide such as indium tin oxide (ITO), indium zinc oxide (IZO), zinc oxide (ZnO), and/or indium tin zinc oxide (ITZO). In some embodiments, the transparent conductive layer may include a conductive polymer such as poly(3,4-ethylenedioxythiophene) (PEDOT), metal nanowires, carbon nanotubes, and/or graphene.

In some embodiments, the second touch insulating layer 540 may be on the second conductive layer 530. The second touch insulating layer 540 may include an inorganic material and/or an organic material. When the second touch insulating layer 540 includes an inorganic material, the second touch insulating layer 540 may include at least one material selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. When the second touch insulating layer 540 includes an organic material, the second touch insulating layer 540 may include at least one material selected from an acrylic resin, a methacrylic resin, polyisoprene, a vinyl-based resin, an epoxy-based resin, a urethane-based resin, a cellulose-based resin, and a perylene-based resin.

In some embodiments, the anti-reflective layer 600 may be on the second touch insulating layer 540. For example, a light blocking layer 610 and a reflection control layer 620 may be on the second touch insulating layer 540. The light blocking layer 610 may include an opening 610OP exposing at least a portion of the touch sensor layer 500. In some embodiments, the light blocking layer 610 may include an opening 610OP exposing at least a portion of the second touch insulating layer 540.

Because the anti-reflective layer 600 including the light blocking layer 610 and the reflection control layer 620 are on the touch sensor layer 500 including the first conductive layer 510 and the second conductive layer 530, the reflectance of external light reflected by the first conductive layer 510 and/or the second conductive layer 530 may be reduced.

In some embodiments, although FIG. 9 illustrate that the first conductive layer 510 and the second conductive layer 530 are on different layers from each other, the disclosure is not limited thereto. Various suitable modifications may be made thereof. For example, the first conductive layer 510 and the second conductive layer 530 may include a single conductive layer, instead of two conductive layers.

Figure 10:
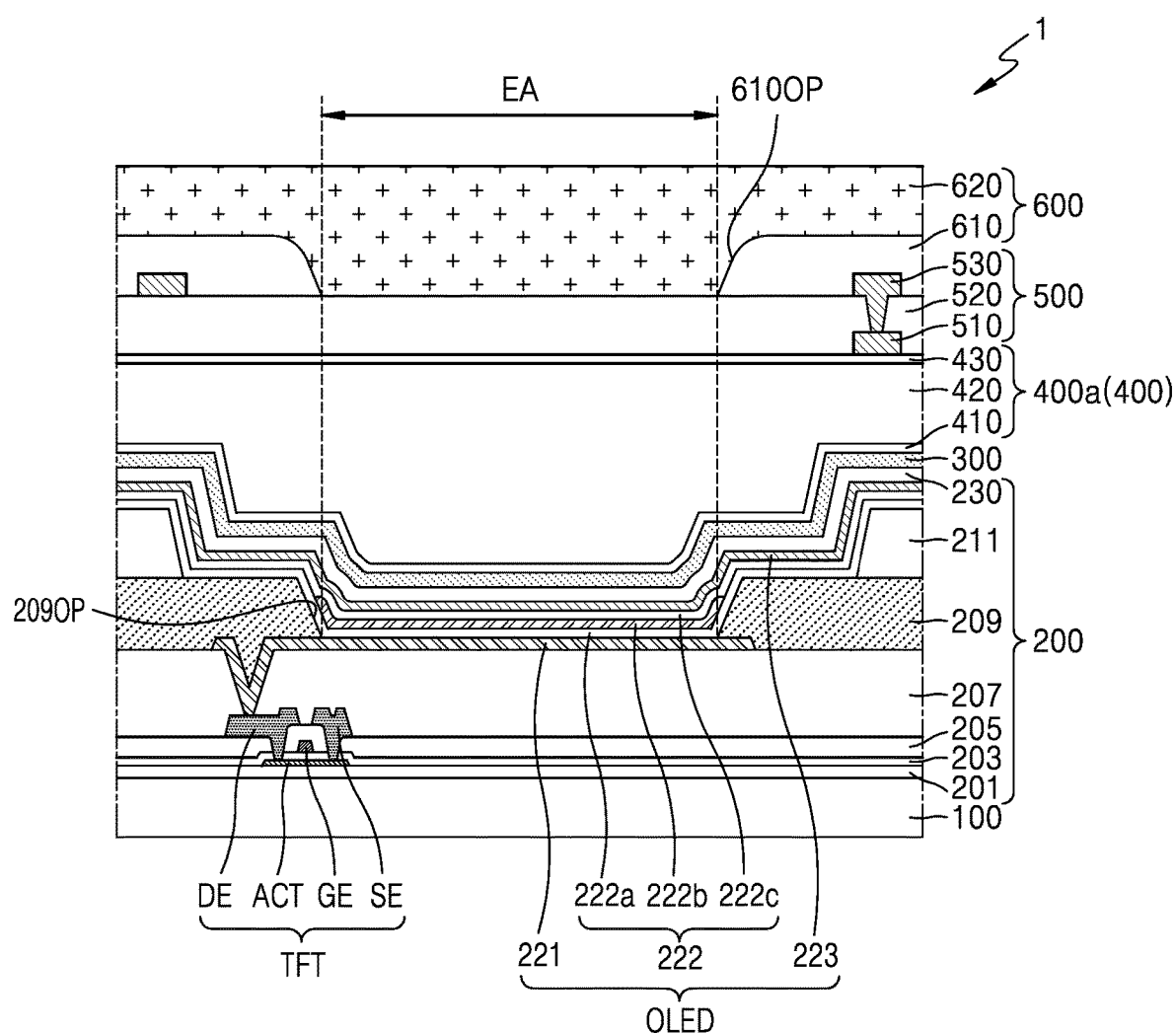
FIG. 10 is a cross-sectional view schematically illustrating a display apparatus according to an embodiment.

FIG. 10 is a cross-sectional view schematically illustrating a display apparatus 1 according to an embodiment. The embodiment of FIG. 10 differs from the embodiment of FIG. 9 in that a light blocking layer 610 of an anti-reflective layer 600 directly covers a second conductive layer 530. In FIG. 10, the same reference numerals as those in FIG. 9 denote the same members, and redundant descriptions thereof may not be repeated here.

Referring to FIG. 10, the display apparatus 1 according to an embodiment may include a touch sensor layer 500 and the anti-reflective layer 600. The touch sensor layer 500 may include a first conductive layer 510, a first touch insulating layer 520, and a second conductive layer 530. The anti-reflective layer 600 may include a light blocking layer 610 and a reflection control layer 620.

The first conductive layer 510 and the second conductive layer 530 of the touch sensor layer 500 may be respectively below and above the first touch insulating layer 520 with the first touch insulating layer 520 therebetween. The anti-reflective layer 600 may be on the second conductive layer 530 of the touch sensor layer 500. In some embodiments, the light blocking layer 610 may be directly on the second conductive layer 530. For example, the light blocking layer 610 may directly cover the second conductive layer 530.

Figure 11:
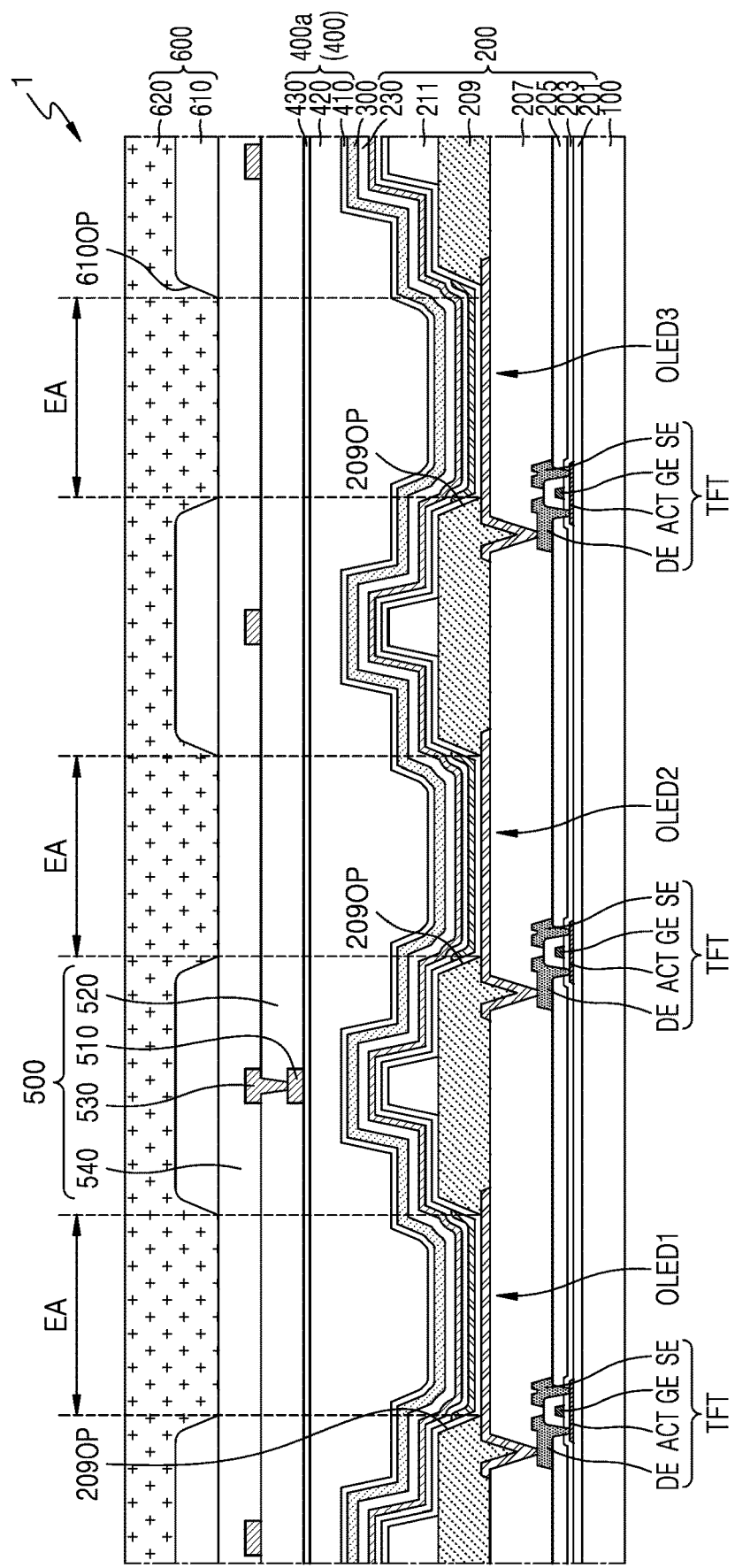
FIGS. 11 and 12 are cross-sectional views schematically illustrating a display apparatus according to an embodiment.
Figure 12:
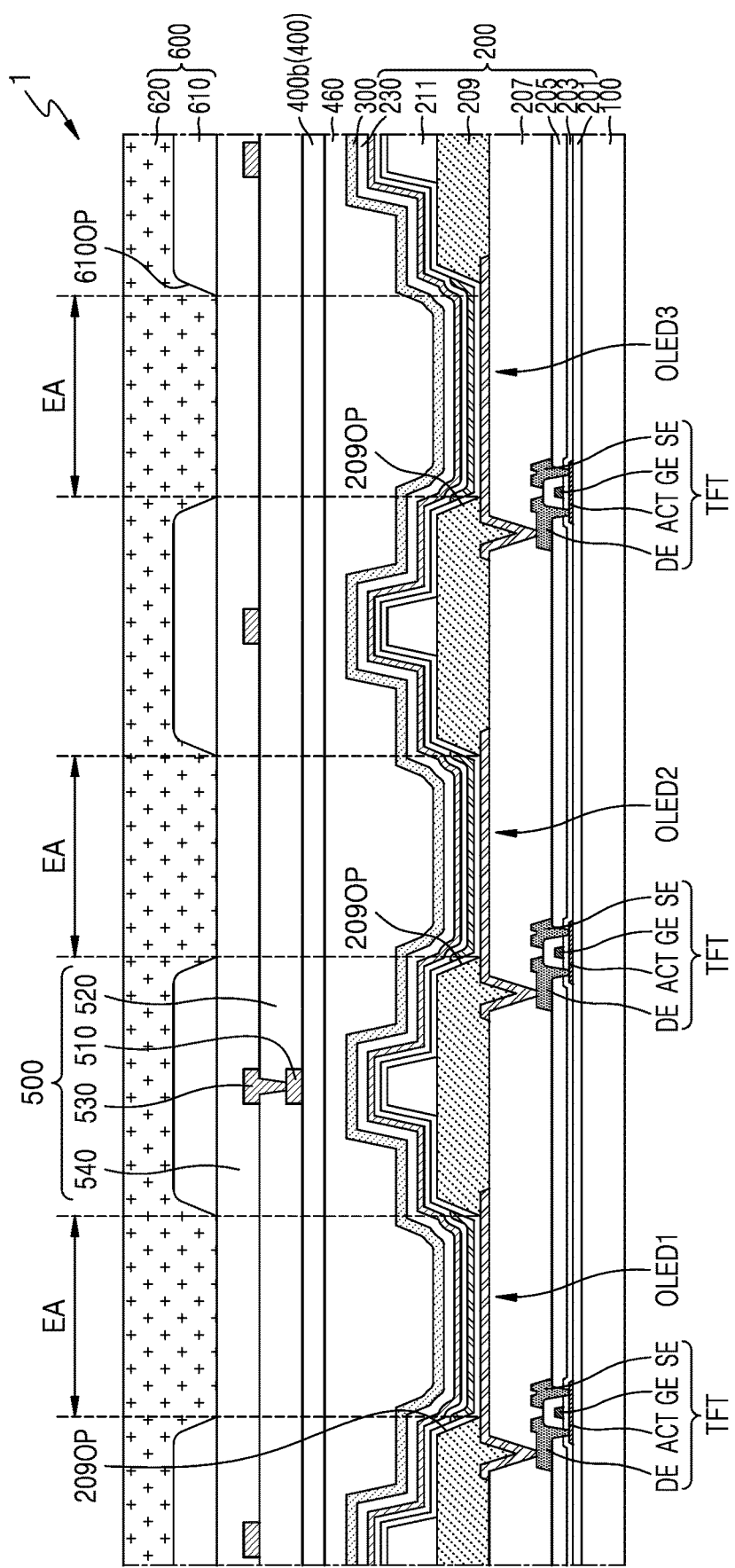

FIGS. 11 and 12 are cross-sectional views schematically illustrating a display apparatus 1 according to an embodiment. In FIGS. 11 and 12, the same reference numerals as those in FIGS. 6 and 8 denote the same members, and redundant descriptions thereof may not be repeated here.

Referring to FIG. 11, in the display apparatus 1 according to an embodiment, a first light-emitting element OLED1, a second light-emitting element OLED2, and a third light-emitting element OLED3, which emit light of different colors from each other, may be on a substrate 100. The low-reflection layer 300 may be arranged as one body on the first, second, and third light-emitting elements OLED1, OLED2, and OLED3.

The low-reflection layer 300 may be on an encapsulation member 400. Therefore, it may be said that the encapsulation member 400 is arranged as one body (e.g., a sole body or unitary body) on the first, second, and third light-emitting elements OLED1, OLED2, and OLED3. In some embodiments, as illustrated in FIG. 11, a thin-film encapsulation layer 400a including at least one inorganic layer and at least one organic layer may be provided as the encapsulation member 400. The thin-film encapsulation layer 400a may include a first inorganic layer 410, an organic layer 420, and a second inorganic layer 430, which are sequentially stacked. In some embodiments, as illustrated in FIG. 12, the encapsulation member 400 may include an encapsulation substrate 400b including glass. A filler 460 may be between the encapsulation substrate 400b and the low-reflection layer 300.

The touch sensor layer 500 may be on the encapsulation member 400.

Therefore, it may be said that the touch sensor layer 500 is arranged as one body (e.g., a sole body or a unitary body) on first, second, and third light-emitting elements OLED1, OLED2, and OLED3.

An anti-reflective layer 600 may be on the touch sensor layer 500. The anti-reflective layer 600 may include a light blocking layer 610 and a reflection control layer 620. The light blocking layer 610 may be on the touch sensor layer 500. In some embodiments, the light blocking layer 610 may include openings 610OP corresponding to emission areas EA of the first, second, and third light-emitting elements OLED1, OLED2, and OLED3. The reflection control layer 620 may fill the openings 610OP of the light blocking layer 610 and may be arranged as one body (e.g., a sole body or a unitary body) on the first, second, and third light-emitting elements OLED1, OLED2, and OLED3. In some embodiments, the display apparatus 1 may further include a capping layer 230 arranged as one body (e.g., a sole body or a unitary body) between the first, second, and third light-emitting elements OLED1, OLED2, and OLED3 and the low-reflection layer 300.

Hereinafter, the display apparatus according to certain embodiments will be described in more detail herein below by way of example.

EXAMPLES

Evaluation Example 1: Spectral Evaluation of Display Apparatus

Display panels of display apparatus according to certain embodiments were prepared as Example Apparatuses 1 to 4.

In Example Apparatus 1 and Example Apparatus 2, a reflection control layer 620 includes 0.01 wt % to 1.5 wt % of a pigment, 0.5 wt % to 2 wt % of a first light absorbing material, 0.05 wt % to 0.2 wt % of a second light absorbing material, and 0.2 wt % to 1.5 wt % of a third light absorbing material, based on 100 wt % of the reflection control layer 620. In this case, Example Apparatus 1 includes C.I. Pigment Yellow 185 (Y185) as the pigment, Tinuvin 970 (brand name, manufactured by BASF) as the first light absorbing material, VD-500 (brand name, manufactured by Wooksung Chemical) as the second light absorbing material, and NEC-594 (brand name, manufactured by Wooksung Chemical) as the third light absorbing material. Example Apparatus 2 includes C.I. Pigment Yellow 185 (Y185) as the pigment, Tinuvin 970 (brand name, manufactured by BASF) as the first light absorbing material, FDB-002 (brand name, manufactured by Yamada Kagaku Kogyo Co., Ltd.) as the second light absorbing material, and NEC-594 (brand name, manufactured by Wooksung Chemical) as the third light absorbing material.

In Example Apparatus 3, a reflection control layer 620 includes 0.01 wt % to 1.5 wt % of a pigment, 0.5 wt % to 2 wt % of a first light absorbing material, 0.005 wt % to 0.2 wt % of a second light absorbing material, and 0.2 wt % to 2 wt % of a third light absorbing material, based on 100 wt % of the reflection control layer 620. In this case, Example Apparatus 3 includes C.I. Pigment Yellow 185 (Y185) as the pigment, Tinuvin 970 (brand name, manufactured by BASF) as the first light absorbing material, VD-500 (brand name, manufactured by Wooksung Chemical) as the second light absorbing material, and NEC-594 (brand name, manufactured by Wooksung Chemical) as the third light absorbing material. Example Apparatus 3 includes C.I. Pigment Green 7 (G7) as the pigment, Tinuvin 970 (brand name, manufactured by BASF) as the first light absorbing material, FDB-002 (brand name, manufactured by Yamada Kagaku Kogyo Co., Ltd.) as the second light absorbing material, and FDG-005 (brand name, manufactured by Yamada Kagaku Kogyo Co., Ltd.) as the third light absorbing material.

In Example Apparatus 4, a reflection control layer 620 includes 0.05 wt % to 2 wt % of a first light absorbing material, 0.05 wt % to 2 wt % of a second light absorbing material, 0.05 wt % to 2 wt % of a third light absorbing material, and 0.05 wt % to 2 wt % of a fourth light absorbing material, based on 100 wt % of the reflection control layer 620. In this case, Example Apparatus 4 includes FDB-002 (brand name, manufactured by Yamada Kagaku Kogyo Co., Ltd.) as the first light absorbing material, VD-500 (brand name, manufactured by Wooksung Chemical) as the second light absorbing material, NEC-594 (brand name, manufactured by Wooksung Chemical) as the third light absorbing material, and FDR-002 (brand name, manufactured by Yamada Kagaku Kogyo Co., Ltd.) as the fourth light absorbing material.

Also, each of Example Apparatuses 1 to 4 may further include 15 wt % to 30 wt % of a base polymer, 60 wt % to 85 wt % of a solvent, 0 wt % (including 0) to 7 wt % of a photoinitiator, and 0 wt % (including 0) to 5 wt % of an additive, based on 100 wt % of the reflection control layer 620. In this case, the above-described materials may be used as the base polymer, the solvent, the photoinitiator, and the additive.

Example Apparatuses 1 to 3 correspond to a case in which the reflection control layer 620 is configured to absorb light in the first wavelength band of 430 nm or less, the second wavelength band of 480 nm to 510 nm, and the third wavelength band of 575 nm to 605 nm, and Example Apparatus 4 corresponds to a case in which the reflection control layer 620 is configured to absorb light in the first wavelength band of 430 nm or less, the second wavelength band of 480 nm to 510 nm, the third wavelength band of 575 nm to 605 nm, and the fourth wavelength band of 650 nm or greater.

Figure 13A:
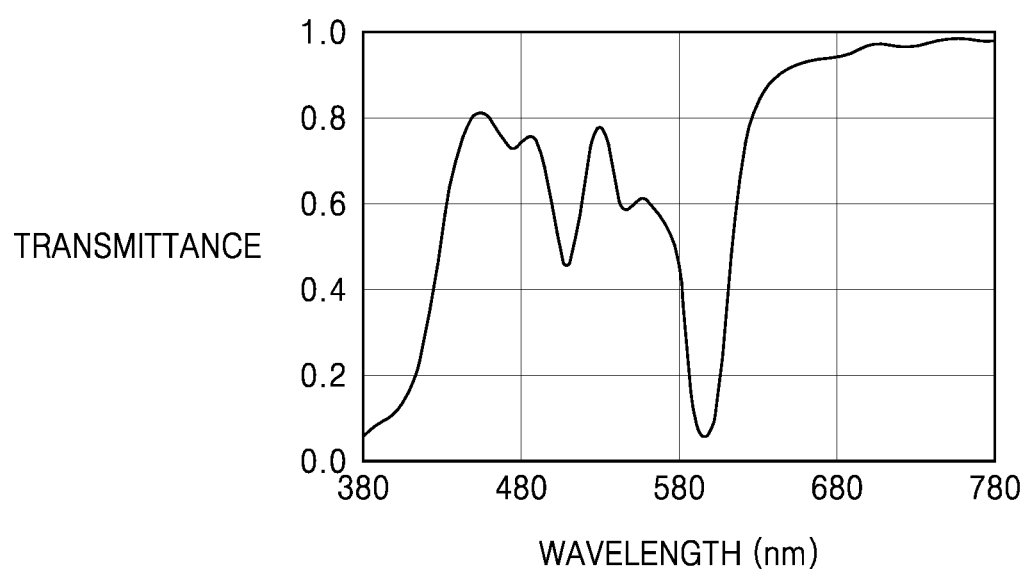
FIGS. 13A to 13D are graphs showing spectral evaluation results of Example Apparatuses 1 to 4, respectively.
Figure 13B:
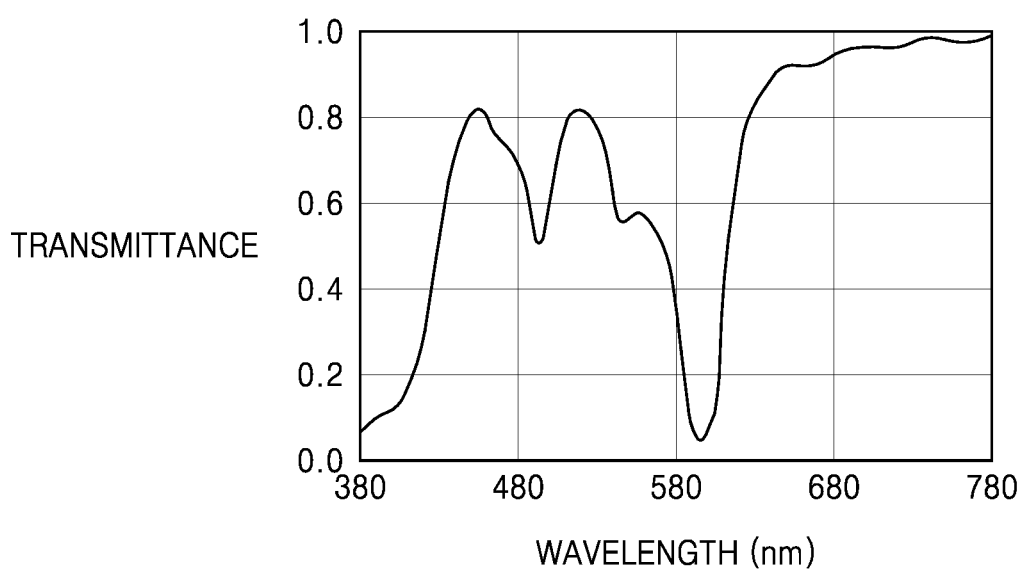
Figure 13C:
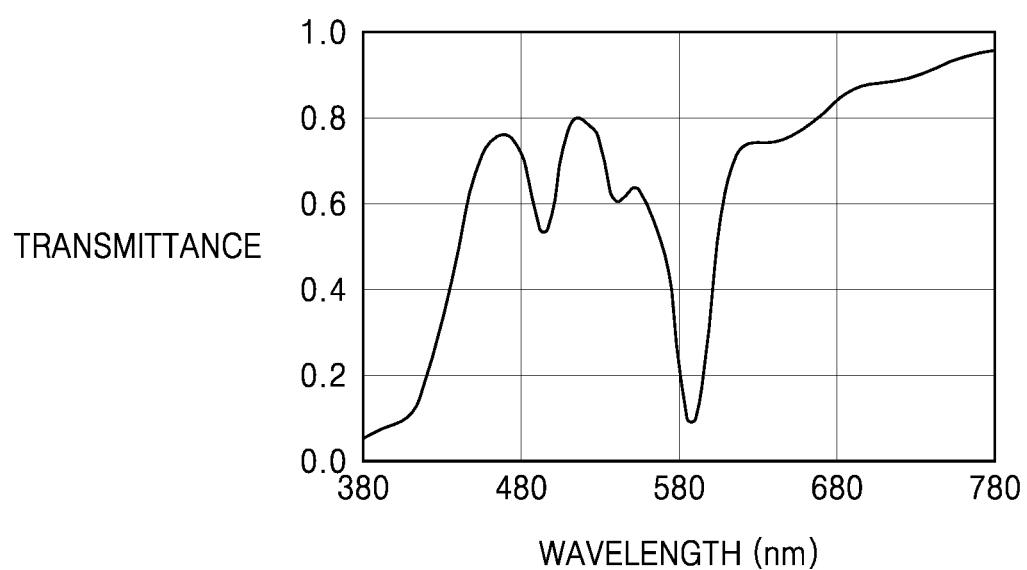
Figure 13D:
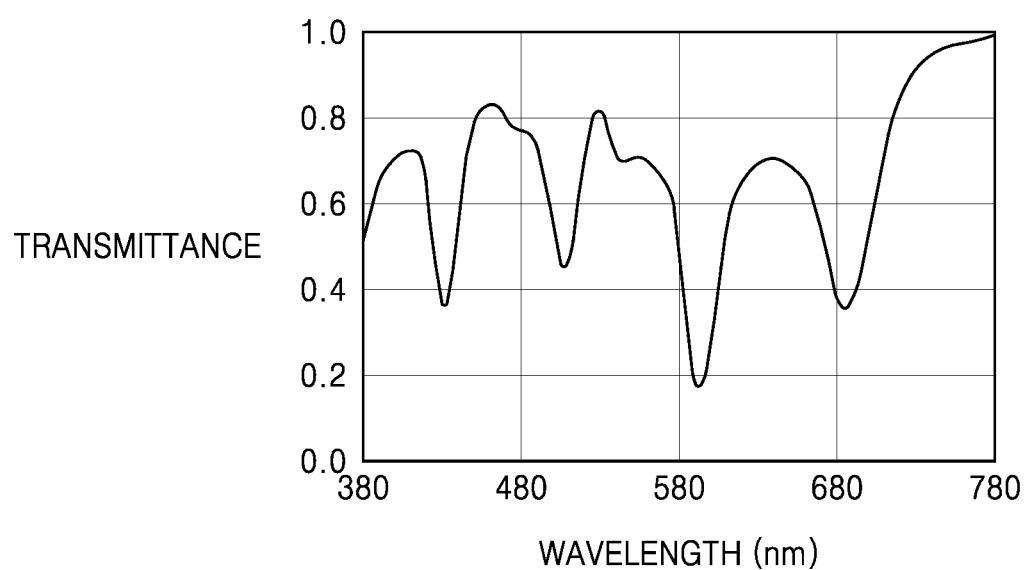

FIGS. 13A to 13D are graphs showing spectral evaluation results of Example Apparatuses 1 to 4, respectively. FIGS. 13A to 13D are graphs showing transmittance according to wavelength, respectively. For example, FIG. 13A is a graph showing the spectral evaluation result of Example Apparatus 1, FIG. 13B is a graph showing the spectral evaluation result of Example Apparatus 2, FIG. 13C is a graph showing the spectral evaluation result of Example Apparatus 3, and FIG. 13D is a graph showing the spectral evaluation result of Example Apparatus 4.

Referring to FIGS. 13A to 13C, it can be seen that the transmittance of the first wavelength band of 430 nm or less, the second wavelength band of 480 nm to 510 nm, and the third wavelength band of 575 nm to 605 nm are low. That is, it can be seen that, when the reflection control layer 620 of the display apparatus 1 includes the first to third light absorbing materials, the reflection control layer 620 is configured to absorb light in the first wavelength band of 430 nm or less, the second wavelength band of 480 nm to 510 nm, and the third wavelength band of 575 nm to 605 nm.

Referring to FIG. 13D, it can be seen that the transmittance of the first wavelength band of 430 nm or less, the second wavelength band of 480 nm to 510 nm, the third wavelength band of 575 nm to 605 nm, and the fourth wavelength band of 650 nm or greater are low. That is, it can be seen that, when the reflection control layer 620 of the display apparatus 1 includes the first to fourth light absorbing materials, the reflection control layer 620 is configured to absorb light in the first wavelength band of 430 nm or less, the second wavelength band of 480 nm to 510 nm, the third wavelength band of 575 nm to 605 nm, and the fourth wavelength band of 650 nm or greater.

Evaluation Example 2: Evaluation of Front/Side Surface Luminance Ratio of Display Apparatus In order to evaluate the front/side surface luminance ratio of the display apparatus 1, Example Apparatus 5 and Comparative Apparatus 1 were prepared.

Example Apparatus 5 corresponds to a case in which the reflection control layer 620 includes the first to fourth light absorbing materials. For example, Example Apparatus 5 corresponds to a case in which the reflection control layer 620 includes FDB-002 (brand name, manufactured by Yamada Kagaku Kogyo Co., Ltd.) as the first light absorbing material, VD-500 (brand name, manufactured by Wooksung Chemical) as the second light absorbing material, NEC-594 (brand name, manufactured by Wooksung Chemical) as the third light absorbing material, and FDR-002 (brand name, manufactured by Yamada Kagaku Kogyo Co., Ltd.) as the fourth light absorbing material. Example Apparatus 5 may be provided in the same manner as Example Apparatus 4 described above.

Comparative Apparatus 1 corresponds to a case in which the reflection control layer 620 includes the second light absorbing material and the third light absorbing material. Specifically, Comparative Apparatus 1 corresponds to a case in which the reflection control layer 620 includes VD-500 (brand name, manufactured by Wooksung Chemical) or FDB-002 (brand name, manufactured by Yamada Kagaku Kogyo Co., Ltd.) as the second light absorbing material, and NEC-594 (brand name, manufactured by Wooksung Chemical) as the third light absorbing material.

Because the reflection control layer 620 of Example Apparatus 5 includes the first to fourth light absorbing materials, the reflection control layer 620 of Example Apparatus 5 may absorb light in the first wavelength band of 430 nm or less, the second wavelength band of 480 nm to 510 nm, the third wavelength band of 575 nm to 605 nm, and the fourth wavelength band of 650 nm or greater.

Because the reflection control layer 620 of Comparative Apparatus 1 includes the second light absorbing material and the third light absorbing material, the reflection control layer 620 of Comparative Apparatus 1 may absorb light in the second wavelength band of 480 nm to 510 nm and the third wavelength band of 575 nm to 605 nm.

Figure 14:
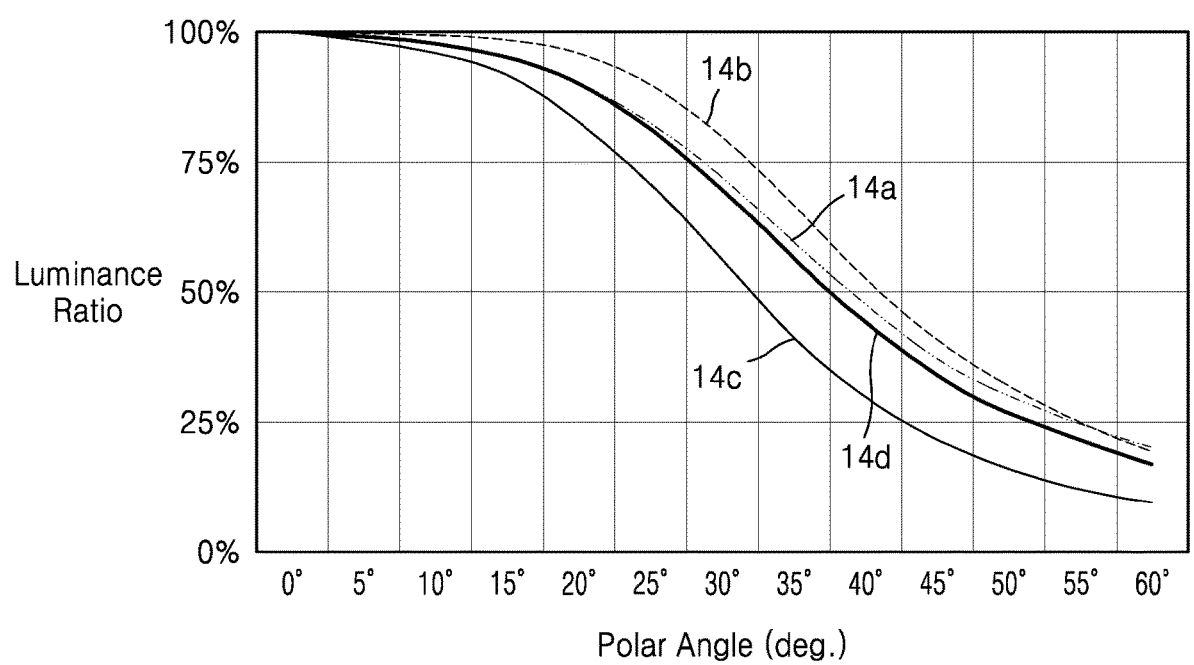
FIGS. 14 and 15 are graphs showing luminance ratios according to polar angles in Example Apparatus 5 and Comparative Apparatus 1, respectively.
Figure 15:
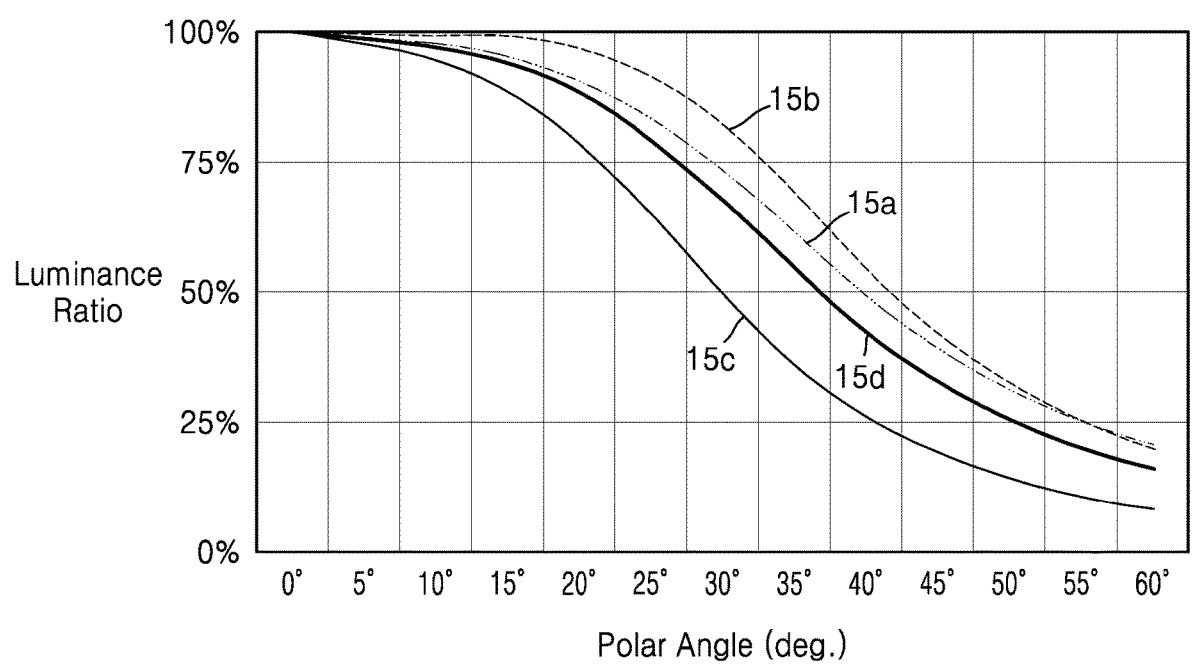

FIGS. 14 and 15 are graphs showing luminance ratios according to polar angles in Example Apparatus 5 and Comparative Apparatus 1, respectively. Specifically, FIGS. 14 and 15 are graphs showing luminances according to observation angles. FIG. 14 shows the luminances (luminance ratios) of the front surface luminance to the side surface luminance according to the polar angles (or observation angles) of blue light 14a, green light 14b, red light 14c, and white light 14d in Example Apparatus 5, and FIG. 15 shows the luminances (luminance ratios) of the front surface luminance to the side surface luminance according to the polar angles (or observation angles) of blue light 15a, green light 15b, red light 15c, and white light 15d in Comparative Apparatus 1. In this case, in FIGS. 14 and 15, when the polar angle (or observation angle) is 0 degrees, it corresponds to the front surface, and as the polar angle (or observation angle) increases, it means that it is closer to the side surface of the display apparatus 1.

Referring to FIGS. 14 and 15, it can be seen that the luminance ratio of the red light 14c in Example Apparatus 5 is greater than the luminance ratio of the red light 15c in Comparative Apparatus 1. The luminance difference of the red light 14c between the front surface and the side surface in Example Apparatus 5 may be less than the luminance difference of the red light 15c between the front surface and the side surface in Comparative Apparatus 1. That is, the luminance change amount of the red light 14c in Example Apparatus 5 may be less than the luminance change amount of the red light 15c in Comparative Apparatus 1. Therefore, Example Apparatus 5 may have more uniform luminance than Comparative Apparatus 1.

Also, it can be seen that the luminance ratio of the white light 14d in Example Apparatus 5 is greater than the luminance ratio of the white light 15d in Comparative Apparatus 1. The luminance difference of the white light 14d between the front surface and the side surface in Example Apparatus 5 may be less than the luminance difference of the white light 15d between the front surface and the side surface in Comparative Apparatus 1. That is, the luminance change amount of the white light 14d in Example Apparatus 5 may be less than the luminance change amount of the white light 15d in Comparative Apparatus 1. Therefore, Example Apparatus 5 may have more uniform luminance than Comparative Apparatus 1.

It can be seen from the disclosure herein that the luminance ratio difference of the green lights 14b and 15b and the red lights 14c and 15c at the same polar angle is less in Example Apparatus 5 than in Comparative Example 1. Specifically, the luminance ratio difference of the green light 14b and the red light 14c at the same polar angle in Example Apparatus 5 may be less than the luminance ratio difference of the green light 15b and the red light 15c in Comparative Apparatus 1. The luminance difference between the front surface and the side surface in Example Apparatus 5 may be less than the luminance difference between the front surface and the side surface in Comparative Apparatus 1. That is, the luminance change amount of Example Apparatus 5 may be less than the luminance change amount of Comparative Apparatus 1. Therefore, Example Apparatus 5 may have more uniform luminance than Comparative Apparatus 1.

Therefore, in the case in which the reflection control layer 620 includes the first to fourth light absorbing materials (that is, the case of absorbing light in four wavelength bands), the luminance according to the angle may increase and the color coordinate change may decrease, compared with the case in which the reflection control layer 620 includes the second light absorbing material and the third light absorbing material (that is, the case of absorbing light in two wavelength bands).

Therefore, in the case in which the reflection control layer 620 includes the first to fourth light absorbing materials (that is, the case of absorbing light in four wavelength bands), the luminance change amount and the color coordinate change amount according to the change in the observation angle with respect to the front perpendicular (or substantially perpendicular) to the display apparatus 1 are reduced to improve display quality, compared with the case in which the reflection control layer 620 includes the second light absorbing material and the third light absorbing material (that is, the case of absorbing light in two wavelength bands).

WAD is an index for evaluating a change in optical characteristics according to an observation angle with respect to a display apparatus, and thus, is an index capable of confirming the degree of improvement in a wide viewing angle.

Therefore, in the case in which the reflection control layer 620 includes the first to fourth light absorbing materials (e.g., in an embodiment capable of absorbing light in four wavelength bands), WAD characteristics may be improved, compared with the case in which the reflection control layer 620 includes the second light absorbing material and the third light absorbing material (e.g., in an embodiment capable of absorbing light in two wavelength bands).

In some embodiments, because the display apparatus 1 includes the low-reflection layer 300 that is on the light-emitting element OLED and includes the inorganic material, destructive interference occurs between the light incident onto the display apparatus 1 and the light reflected from the metal below the low-reflection layer 300, and thus, the reflectance of external light in the display apparatus 1 may be reduced to improve display quality and visibility of the display apparatus 1.

In some embodiments, because the display apparatus 1 includes the reflection control layer 620 that is on the low-reflection layer 300 and is configured to absorb light in at least three wavelength bands selected from the first wavelength band of 430 nm or less, the second wavelength band of 480 nm to 510 nm, the third wavelength band of 575 nm to 605 nm, and the fourth wavelength band of 650 nm or greater, the luminance change amount and the color coordinate change amount according to the change in the observation angle with respect to the front perpendicular (or substantially perpendicular) to the display apparatus 1 may be reduced to improve display quality.

According to one or more embodiments, the display apparatus in which visibility is improved by reducing the reflection of external light may be implemented. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
a substrate;
a light-emitting element on the substrate;
a low-reflection layer on the light-emitting element, the low-reflection layer comprising an inorganic material; and
a reflection control layer on the low-reflection layer,
wherein the reflection control layer is a single, continuous layer that absorbs light in at least three wavelength bands selected from a first wavelength band of 430 nm or less, a second wavelength band of 480 nm to 510 nm, a third wavelength band of 575 nm to 605 nm, and a fourth wavelength band of 650 nm or greater.

2. The display apparatus of claim 1, wherein the reflection control layer comprises at least three light absorbing materials selected from a first light absorbing material that absorbs light in the first wavelength band, a second light absorbing material that absorbs light in the second wavelength band, a third light absorbing material that absorbs light in the third wavelength band, and a fourth light absorbing material that absorbs light in the fourth wavelength band.

3. The display apparatus of claim 2, wherein an amount of each of the at least three light absorbing materials is 0.005 wt % to 5 wt %, based on the total weight of the reflection control layer.

4. The display apparatus of claim 1, wherein the inorganic material has a refractive index of 1 or greater.

5. The display apparatus of claim 1, wherein the inorganic material has an absorption coefficient of 0.5 or greater.

6. The display apparatus of claim 1, wherein the inorganic material comprises ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof.

7. The display apparatus of claim 1, further comprising a light blocking layer on the light-emitting element, the light blocking layer having an opening corresponding to an emission area of the light-emitting element.

8. The display apparatus of claim 7, wherein the reflection control layer fills the opening.

9. The display apparatus of claim 7, further comprising a touch sensor layer between the low-reflection layer and the reflection control layer,
wherein the light blocking layer is on the touch sensor layer.

10. The display apparatus of claim 1, further comprising a capping layer between the light-emitting element and the low-reflection layer.

11. The display apparatus of claim 1, further comprising an encapsulation member on the low-reflection layer.

12. The display apparatus of claim 11, wherein the encapsulation member comprises a thin-film encapsulation layer including at least one inorganic layer and at least one organic layer.

13. The display apparatus of claim 11, wherein the encapsulation member comprises an encapsulation substrate, and
a filler is further between the low-reflection layer and the encapsulation substrate.

14. A display apparatus comprising:
a substrate;
a first light-emitting element, a second light-emitting element, and a third light-emitting element on the substrate;
a low-reflection layer arranged as one body on the first to third light-emitting elements and comprising an inorganic material; and
a reflection control layer that is on the low-reflection layer and is a single, continuous layer that absorbs light in at least three wavelength bands selected from a first wavelength band of 430 nm or less, a second wavelength band of 480 nm to 510 nm, a third wavelength band of 575 nm to 605 nm, and a fourth wavelength band of 650 nm or greater,
wherein the first light-emitting element, the second light-emitting element, and the third light-emitting element emit light of different colors from each other.

15. The display apparatus of claim 14, wherein the reflection control layer comprises at least three light absorbing materials selected from a first light absorbing material that absorbs light in the first wavelength band, a second light absorbing material that absorbs light in the second wavelength band, a third light absorbing material that absorbs light in the third wavelength band, and a fourth light absorbing material that absorbs light in the fourth wavelength band, and
an amount of each of the at least three light absorbing materials is 0.005 wt % to 5 wt %, based on the total weight of the reflection control layer.

16. The display apparatus of claim 14, wherein the inorganic material has a refractive index of 1 or greater and an absorption coefficient of 0.5 or greater and comprises ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof.

17. The display apparatus of claim 14, further comprising a light blocking layer on at least one of the first light-emitting element, the second light-emitting element, or the third light-emitting element, the light blocking layer having an opening corresponding to an emission area of the light-emitting element,
wherein the reflection control layer fills the opening.

18. The display apparatus of claim 17, further comprising:
an encapsulation member on the low-reflection layer;
a touch sensor layer between the low-reflection layer and the reflection control layer; and
a capping layer between at least one of the first light-emitting element, the second light-emitting element, or the third light-emitting element, and the low-reflection layer,
wherein the light blocking layer is on the touch sensor layer.

19. The display apparatus of claim 18, wherein the encapsulation member comprises a thin-film encapsulation layer comprising at least one inorganic layer and at least one organic layer.

20. The display apparatus of claim 18, wherein the encapsulation member comprises an encapsulation substrate, and
a filler is further between the low-reflection layer and the encapsulation substrate.

* * * * *